(12) United States Patent
Aizawa et al.

(10) Patent No.: US 12,035,062 B2
(45) Date of Patent: Jul. 9, 2024

(54) SEMICONDUCTOR DEVICE AND EQUIPMENT

(71) Applicant: Canon Kabushiki Kaisha, Tokyo (JP)

(72) Inventors: Eiji Aizawa, Tokyo (JP); Eiki Aoyama, Chiba (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 17/684,769

(22) Filed: Mar. 2, 2022

(65) Prior Publication Data

US 2022/0286638 A1 Sep. 8, 2022

(30) Foreign Application Priority Data

Mar. 3, 2021 (JP) ................................. 2021-033729

(51) Int. Cl.
*H04N 25/79* (2023.01)
*H01L 27/146* (2006.01)
*H04N 17/00* (2006.01)
*H04N 25/76* (2023.01)

(52) U.S. Cl.
CPC ........... *H04N 25/79* (2023.01); *H04N 17/002* (2013.01); *H04N 25/76* (2023.01); *H01L 27/14634* (2013.01)

(58) Field of Classification Search
CPC ...... H04N 25/79; H04N 17/002; H04N 25/76; H04N 25/745; H01L 27/14634

USPC ......................................................... 348/308
See application file for complete search history.

(56) References Cited

U.S. PATENT DOCUMENTS

| | | | |
|---|---|---|---|
| 2016/0112700 A1* | 4/2016 | Fei | H04N 25/68 |
| | | | 324/750.3 |
| 2016/0150165 A1* | 5/2016 | Grauer | H04N 25/622 |
| | | | 348/308 |
| 2019/0297287 A1* | 9/2019 | Oka | H04N 25/683 |
| 2020/0014872 A1 | 1/2020 | Kawazu | |
| 2022/0046201 A1* | 2/2022 | Asakura | H01L 27/14612 |
| 2022/0094874 A1* | 3/2022 | Asakura | H04N 17/00 |
| 2022/0394202 A1* | 12/2022 | Takahashi | H04N 25/75 |

FOREIGN PATENT DOCUMENTS

| | | |
|---|---|---|
| JP | 2014017834 A | 1/2014 |
| WO | 2017209221 W | 12/2017 |
| WO | 2018150778 | 8/2018 |

* cited by examiner

*Primary Examiner* — Lin Ye
*Assistant Examiner* — Chan T Nguyen
(74) *Attorney, Agent, or Firm* — Venable LLP

(57) ABSTRACT

A semiconductor device in which a plurality of substrates including a first substrate and a second substrate are stacked, wherein the first substrate includes a pixel unit in which a plurality of pixels are arranged, the second substrate includes a control circuit configured to control the semiconductor device, and the first substrate further includes a detection circuit configured to detect a connection state of a connection portion between the first substrate and the second substrate.

17 Claims, 15 Drawing Sheets

SEMICONDUCTOR DEVICE AND EQUIPMENT

BACKGROUND OF THE INVENTION

Field of the Invention

The present invention relates to a technique for relieving a connection failure between substrates in a semiconductor device.

Description of the Related Art

There is proposed an image sensor manufacturing method of completing a stacked image sensor by creating an image capturing unit and a logic unit of the image sensor by different substrates and stacking these substrates. The number of signals communicated between the substrates can be largely increased by stacking the substrates, and a data transfer amount between the substrates can be increased accordingly, thereby implementing an advanced, high-quality image sensor.

While the stacked image sensor has such advantage, a problem is imposed in the reliability and durability of the connection portion between the substrates. More specifically, a connection failure of the substrate connection portion or the like may occur after the substrates are stacked, thereby decreasing the yield.

Conventionally, as a technique for solving timing violation of signal transmission between substrates in a stacked image sensor, there is known a timing improvement method described in Japanese Patent Laid-Open No. 2014-17834.

However, the method described in Japanese Patent Laid-Open No. 2014-17834 is a method of improving the timing of signal transmission, and cannot deal with a case in which a connection failure of a substrate connection portion occurs.

SUMMARY OF THE INVENTION

The present invention has been made in consideration of the above-described problem, and provides a semiconductor device that can detect the fact that the connection state of a substrate connection portion in the semiconductor device does not satisfy a predetermined state.

According to a first aspect of the present invention, there is provided a semiconductor device in which a plurality of substrates including a first substrate and a second substrate are stacked, wherein the first substrate includes a pixel unit in which a plurality of pixels are arranged, the second substrate includes a control circuit configured to control the semiconductor device, and the first substrate further includes a detection circuit configured to detect a connection state of a connection portion between the first substrate and the second substrate.

According to a second aspect of the present invention, there is provided an equipment comprising: a semiconductor device in which a plurality of substrates including a first substrate and a second substrate are stacked, the first substrate including a pixel unit in which a plurality of pixels are arranged, the second substrate including a control circuit configured to control the semiconductor device, and the first substrate further including a detection circuit configured to detect a connection state of a connection portion between the first substrate and the second substrate; and at least one of an optical device corresponding to the semiconductor device, a control device configured to control the semiconductor device, a processing device configured to process a signal output from the semiconductor device, a display device configured to display information obtained by the semiconductor device, a storage device configured to store the information obtained by the semiconductor device, and a mechanical device configured to operate based on the information obtained by the semiconductor device.

Further features of the present invention will become apparent from the following description of exemplary embodiments with reference to the attached drawings.

DESCRIPTION OF THE EMBODIMENTS

Figure 1:
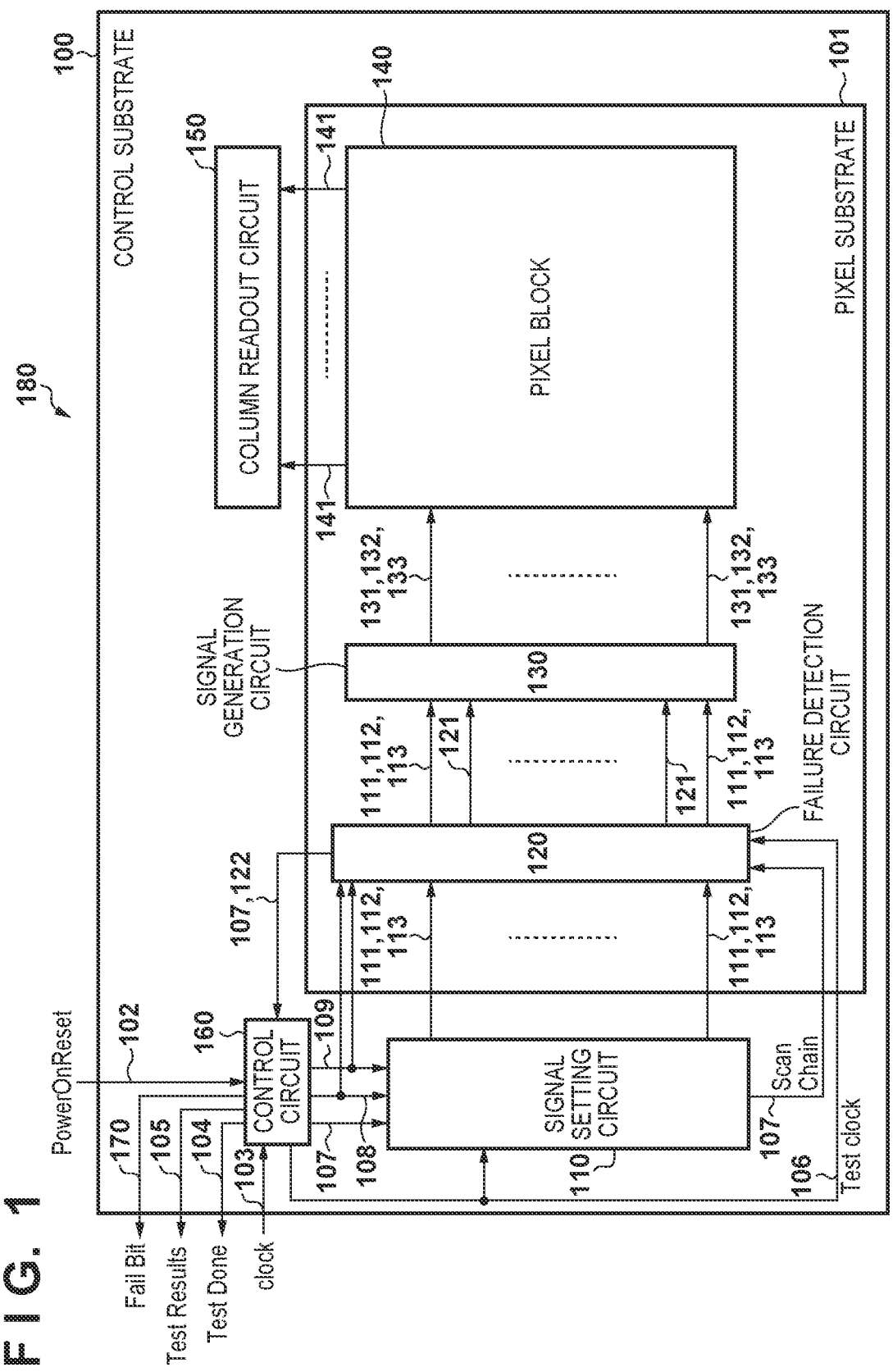
FIG. 1 is a block diagram showing the arrangement of a stacked image sensor according to the first embodiment of the present invention.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

First Embodiment

This embodiment will describe an example in which when, in a stacked image sensor formed by stacking substrates, a failure occurs in a connection portion for transmitting a row reset signal or a transfer signal between the substrates, a failure location is detected and a transmission failure of the row reset signal or the transfer signal is relieved.

[Example of Arrangement of Device]

FIG. 1 is a block diagram showing the arrangement of a stacked image sensor 180 according to the first embodiment of the present invention. Referring to FIG. 1, the stacked image sensor 180 is a CMOS image sensor, and is formed by including a pixel substrate 101 (first substrate) on which pixels are two-dimensionally arranged and a control substrate 100 (second substrate) for generating control signals of the pixels, and stacking these substrates. The control signals of the pixels generated by the control substrate 100 are transmitted to the pixel substrate 101 via the connection portion between the substrates.

Note that the two substrates are stacked in this embodiment but the number of substrates is not limited to two and three or more substrates may be stacked.

The control substrate 100 includes a control circuit 160 that controls a connection failure test of the substrate connection portion, a signal setting circuit 110 that sets test signals in shutter signals 111, 112, and 113 (to be described later), and a column readout circuit 150 that converts pixel data output from a pixel block (pixel unit) 140 (to be described later) into digital values.

The control circuit 160 receives, as input signals, a power-on reset signal 102, a clock 103, and a scan chain 107 and a failure detection signal 122 output from a failure detection circuit 120 (detection circuit) (to be described later). The control circuit 160 outputs, as output signals, a test end signal 104, a test result signal 105 for making a notification of the presence/absence of a failure, a failure location notification signal 170 for making a notification of information capable of specifying a failure location, a test clock 106, the scan chain 107, a shift enable signal 108, and a test mode signal 109. The control circuit 160 controls the overall stacked image sensor 180.

The signal setting circuit 110 receive, as input signals, the test clock 106, the scan chain 107, the shift enable signal 108, and the test mode signal 109 all of which are output from the control circuit 160. The signal setting circuit 110 outputs the shutter signals 111, 112, and 113 and the scan chain 107 as output signals.

The pixel substrate 101 includes the failure detection circuit 120 that detects a connection failure of the signal paths of the shutter signals 111, 112, and 113, a signal generation circuit 130 that generates signals for controlling the pixel block 140, and the pixel block 140 that converts light into charges.

The failure detection circuit 120 receives, as input signals, the test clock 106, the shift enable signal 108, and the test mode signal 109 which are output from the control circuit 160, and the shutter signals 111, 112, and 113 and the scan chain 107 which are output from the signal setting circuit 110. The failure detection circuit 120 outputs, as output signals, the shift enable signal 108, the scan chain 107, the shutter signals 111, 112, and 113, and a shutter control signals 121 corresponding to the shutter signals.

The signal generation circuit 130 receives, as input signals, the shutter signals 111, 112, and 113 and the shutter control signals 121 all of which are output from the failure detection circuit 120.

The pixel block 140 receives, as input signals, the shutter signals 111, 112, and 113 output from the signal generation circuit 130. The pixel block 140 includes a plurality of column signal lines 141 as signal lines for outputting output signals.

The plurality of column signal lines 141, the number of which is equal to the number of columns of the pixel block 140 that can be read out, are arranged, and electrical signals read out as pixel data from the pixels are output. The pixel data output from the pixel block 140 are input to the column readout circuit 150 via the column signal lines 141, and converted into digital values.

The shutter signals 111, 112, and 113 output from the signal setting circuit 110 are signals transmitted across the control substrate 100 and the pixel substrate 101, and signals associated with the shutter operation of the pixels and the readout operation of the pixels. The shutter signal 111 is a row reset signal (the shutter signal 111 will be referred to as the row reset signal hereinafter), the shutter signal 112 is a transfer signal (the shutter signal 112 will be referred to as the transfer signal hereinafter), and these signals are used for the electronic shutter operation of the pixels. The shutter signal 113 is a row selection signal (the shutter signal 113 will be referred to as the row selection signal hereinafter), and is used for readout of the pixel signals. The row reset signal 111, the transfer signal 112, and the row selection signal 113 are signals used for shutter control and pixel data readout control of the pixel block 140.

[Electronic Shutter Operation of Pixel Block 140]

The pixel signal readout operation and electronic shutter operation of the pixel block 140 according to this embodiment will be described with reference to FIGS. 2 and 3.

Figure 2:
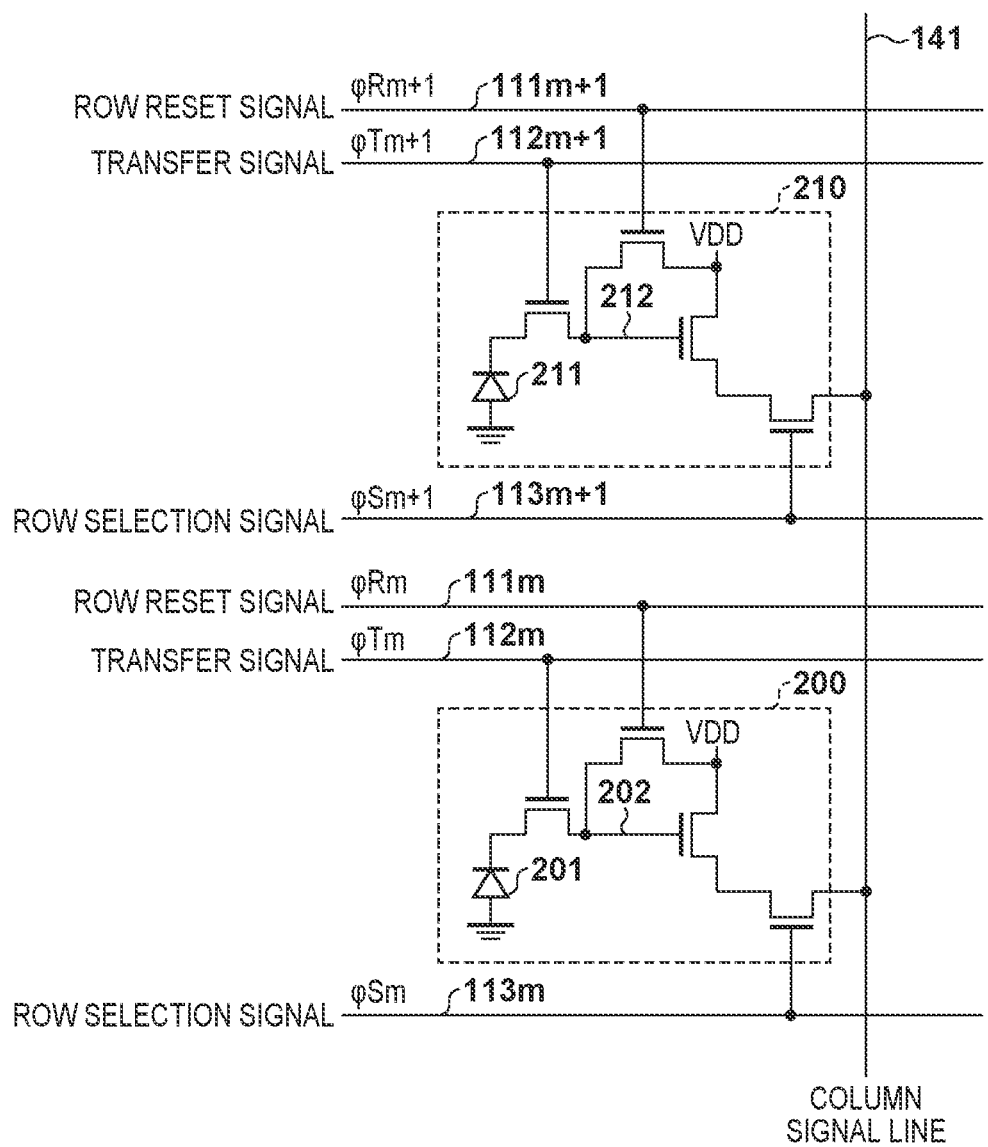
FIG. 2 is a circuit diagram showing the arrangement of pixels according to the first embodiment.

Referring to FIG. 2, pixels 200 and 210 indicate two adjacent pixels (two adjacent pixel rows) in the pixel block 140.

A row reset signal $111m$ indicates a signal for resetting the mth row of the pixel block 140 among the above-described shutter signals, and a row reset signal $111m+1$ similarly indicates a signal for resetting the (m+1)th row.

A transfer signal $112m$ indicates a signal for transferring pixel signals of the mth row of the pixel block 140 among the above-described shutter signals, and a transfer signal $112m+1$ similarly indicates a signal for transferring pixel signals of the (m+1)th row.

A row selection signal $113m$ indicates a signal for selecting the mth row of the pixel block 140 among the above-described shutter signals, and a row selection signal $113m+1$ similarly indicates a signal for selecting the (m+1)th row.

Referring to FIG. 2, each of photodiodes (to be referred to as PDs hereinafter) 201 and 211 as photoelectric conversion units receives light, and generates charges. When the transfer signals $112m$ and $112m+1$ are set at high level, the charges accumulated in the PDs 201 and 211 are transferred to floating diffusion units (to be referred to as FD units hereinafter) 202 and 212 (to be described later), respectively.

The FD units 202 and 212 are portions that can hold the charges transferred from the PDs, and hold the charges while the row reset signals $111m$ and $111m+1$ are at low level, and clear the held charges when the row reset signals $111m$ and $111m+1$ are set at high level, respectively. When each of the row selection signals $113m$ and $113m+1$ is set at high level, the charges held in each of the FD units 202 and 212 are output as an electrical signal to the column signal line 141.

Figure 3:
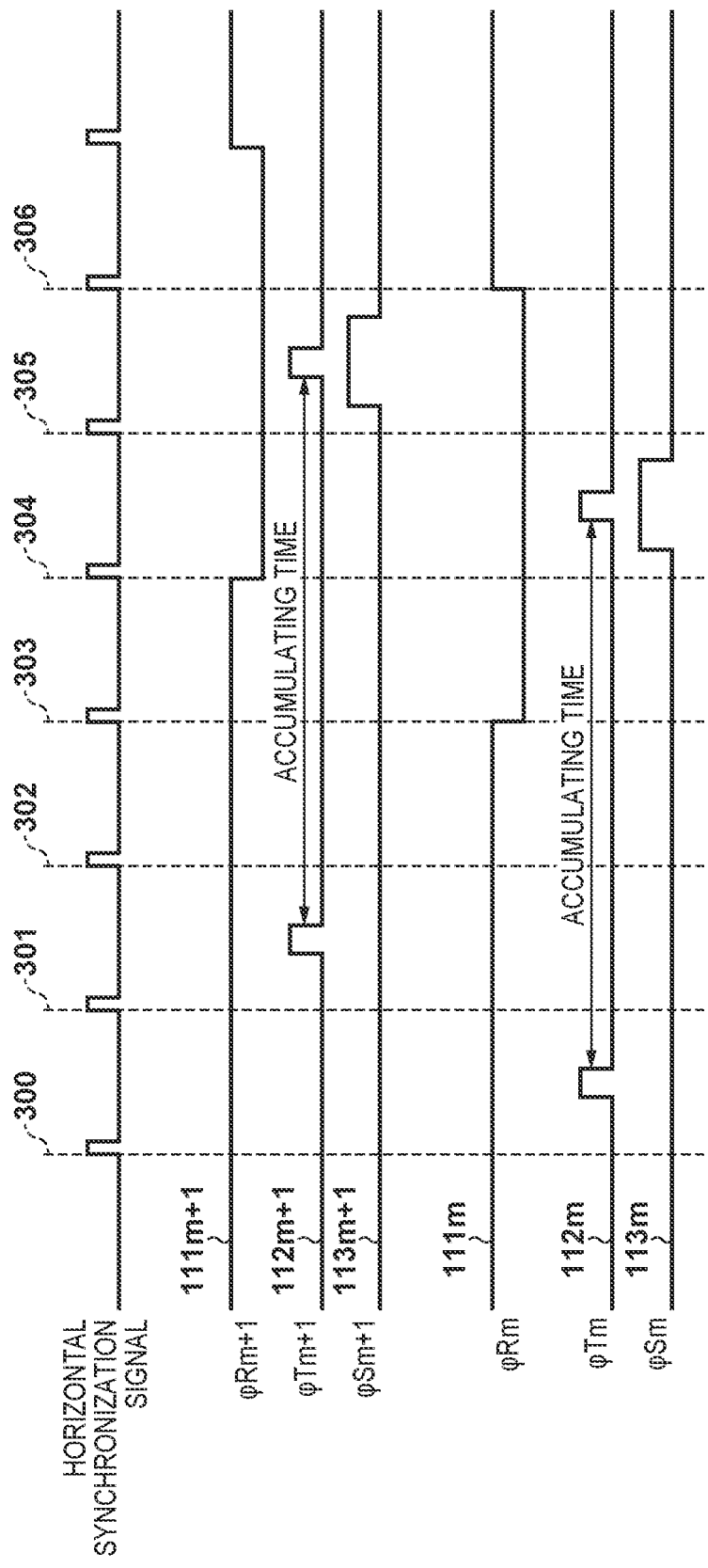
FIG. 3 is a timing chart of the waveforms of an electronic shutter operation according to the first embodiment.

FIG. 3 shows the waveforms of the electronic shutter operation of the above-described pixels 200 and 210, and the time elapses from left to right. Timings 300 to 306 indicate synchronization timings of the horizontal synchronization signal of the stacked image sensor 180. The shutter signals 111, 112, and 113 perform a shutter operation in synchronism with the timings 300 to 306.

At the timing 300, the row reset signals 111m and 111m+1 are at high level, and the charges existing in the FD units 202 and 212 are cleared.

When the transfer signal 112m of the pixel 200 is set at high level during a period from the timing 300 to the timing 301, the charges accumulated in the PD 201 are transferred to the FD unit 202, and then cleared. When the transfer signal 112m changes to low level, the PD 201 starts accumulation of charges. The row reset signal 111 m is set at low level during a period from the timing 303 to the timing 306, and the row selection signal 113m is set at high level and the transfer signal 112m is set at high level during a period from the timing 304 to the timing 305. This transfers the charges accumulated in the PD 201 to the FD unit 202, and outputs them as an electrical signal to the column signal line 141.

In the CMOS image sensor, since the respective rows generally share the column signal line 141, the pixel signals are read out on a row basis, and the pixel signals of the (m+1)th row are read out after the end of readout of the pixel signals of mth row. Therefore, the row selection signal 113m+1 is controlled to be set at high level during a period from the timing 305 to the timing 306 so the period during which the row selection signal 113m is at high level does not overlap the period during which the row selection signal 113m+1 is at high level.

As described above, readout of the pixels 200 and 210 can be continuously performed. By performing the series of operations for all the rows of the pixel block 140, all the pixel data can be read out from the pixel block 140.

Note that in this embodiment, the pixel signals of the pixel block 140 are read out from the lower row to the upper row. However, the readout direction is not limited to this. For example, the pixel signals of the pixel block 140 may be read out from the upper row to the lower row.

[Arrangement of Signal Setting Circuit 110]

Figure 4:
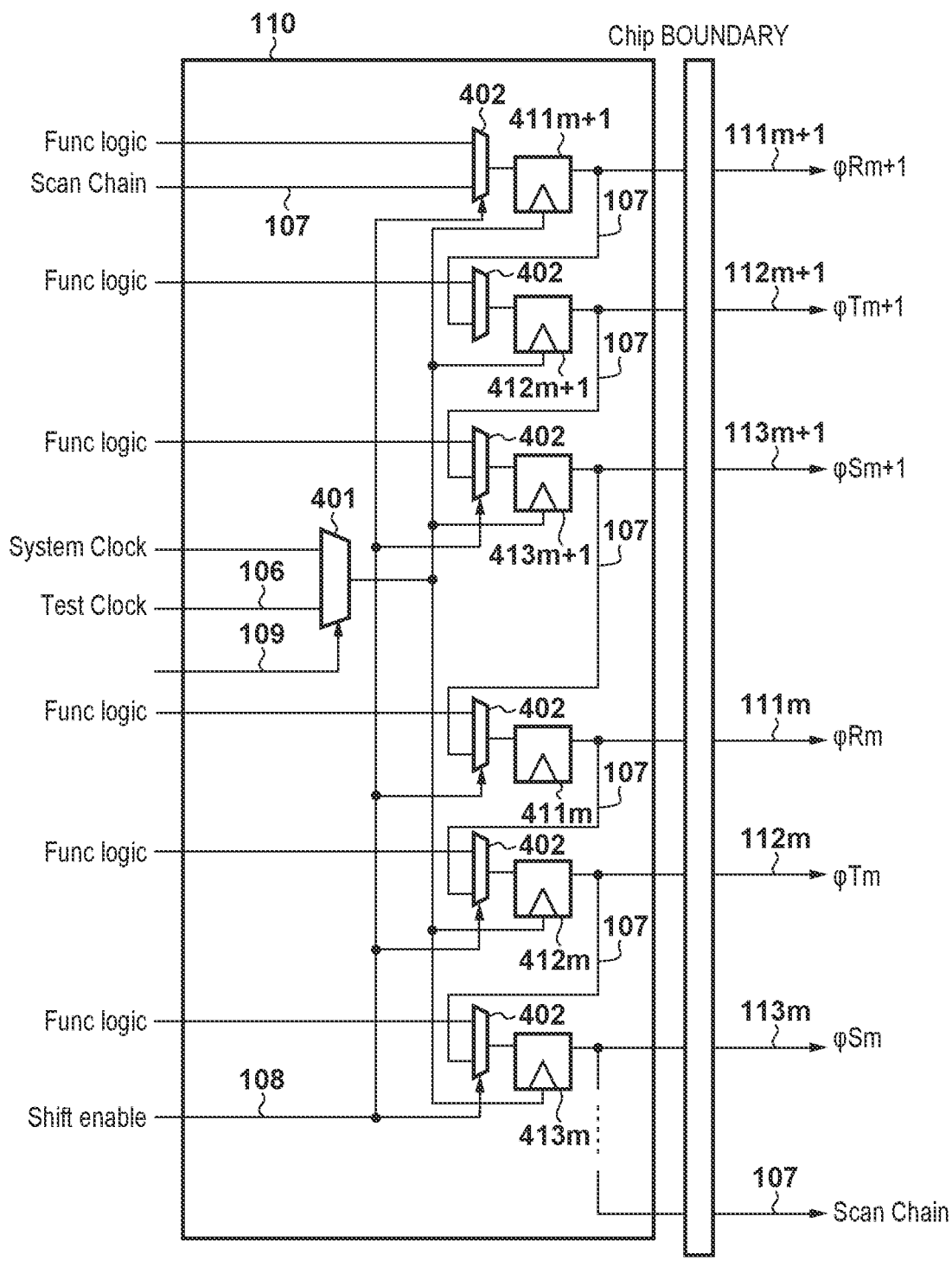
FIG. 4 is a circuit diagram showing the arrangement of a signal setting circuit according to the first embodiment.

The arrangement of the signal setting circuit 110 according to the first embodiment will be described with reference to FIG. 4. Note that the same reference numerals as in FIGS. 1 to 3 denote the same blocks and a description thereof will be omitted. FIG. 4 shows the arrangement of the signal setting circuit 110 corresponding to the mth and (m+1)th rows of the pixel block 140.

Referring to FIG. 4, a clock switching unit 401 is a circuit that switches between a system clock and the test clock 106. Switching control is performed so that the test clock 106 is selected when the test mode signal 109 is at high level.

A scan switching unit 402 is a circuit that switches between the scan chain 107 and a function logic. Switching control is performed so that the scan chain 107 is selected when the shift enable signal 108 is at high level.

A flip-flop 411m is a flip-flop that outputs the row reset signal 111m for resetting the pixel block of the mth row, and latches the signal output from the scan switching unit 402 in synchronism with the clock output from the clock switching unit 401.

A flip-flop 412m is a flip-flop that outputs the transfer signal 112m of the pixel block of the mth row, and latches the signal output from the scan switching unit 402 in synchronism with the clock output from the clock switching unit 401.

A flip-flop 413m is a flip-flop that outputs the row selection signal 113m of the pixel block of the mth row, and latches the signal output from the scan switching unit 402 in synchronism with the clock output from the clock switching unit 401.

Similarly, a flip-flop 411m+1 is a flip-flop that outputs the row reset signal 111m+1 for resetting the pixel block of the (m+1)th row, and latches the signal output from the scan switching unit 402 in synchronism with the clock output from the clock switching unit 401.

A flip-flop 412m+1 is a flip-flop that outputs the transfer signal 112m+1 of the pixel block of the (m+1)th row, and latches the signal output from the scan switching unit 402 in synchronism with the clock output from the clock switching unit 401.

A flip-flop 413m+1 is a flip-flop that outputs the row selection signal 113m+1 of the pixel block of the (m+1)th row, and latches the signal output from the scan switching unit 402 in synchronism with the clock output from the clock switching unit 401.

The scan chain 107 continuously connects the flip-flops 411m. 412m, 413m, 411m+1, 412m+1, and 413m+1 via the scan switching units 402.

The row reset signals 111m and 111m+1, the transfer signals 112m and 112m+1, and the row selection signals 113m and 113m+1 all of which are output from the signal setting circuit 110 are transmitted to the pixel substrate 101 across the connection portion between the substrates.

FIG. 4 shows an example of the arrangement of the signal setting circuit 110 corresponding to the mth and (m+1)th rows of the pixel block 140. However, the arrangement of the signal setting circuit 110 is not limited to the mth and (m+1)th rows, and there exist as many of the same kind of circuits as necessary for shutter control and pixel data readout of the pixel block 140.

[Arrangement of Failure Detection Circuit 120]

The arrangement of the failure detection circuit 120 according to the first embodiment will be described with reference to FIG. 5. Note that the same reference numerals as in FIGS. 1 to 4 denote the same blocks and a description thereof will be omitted.

Figure 5:
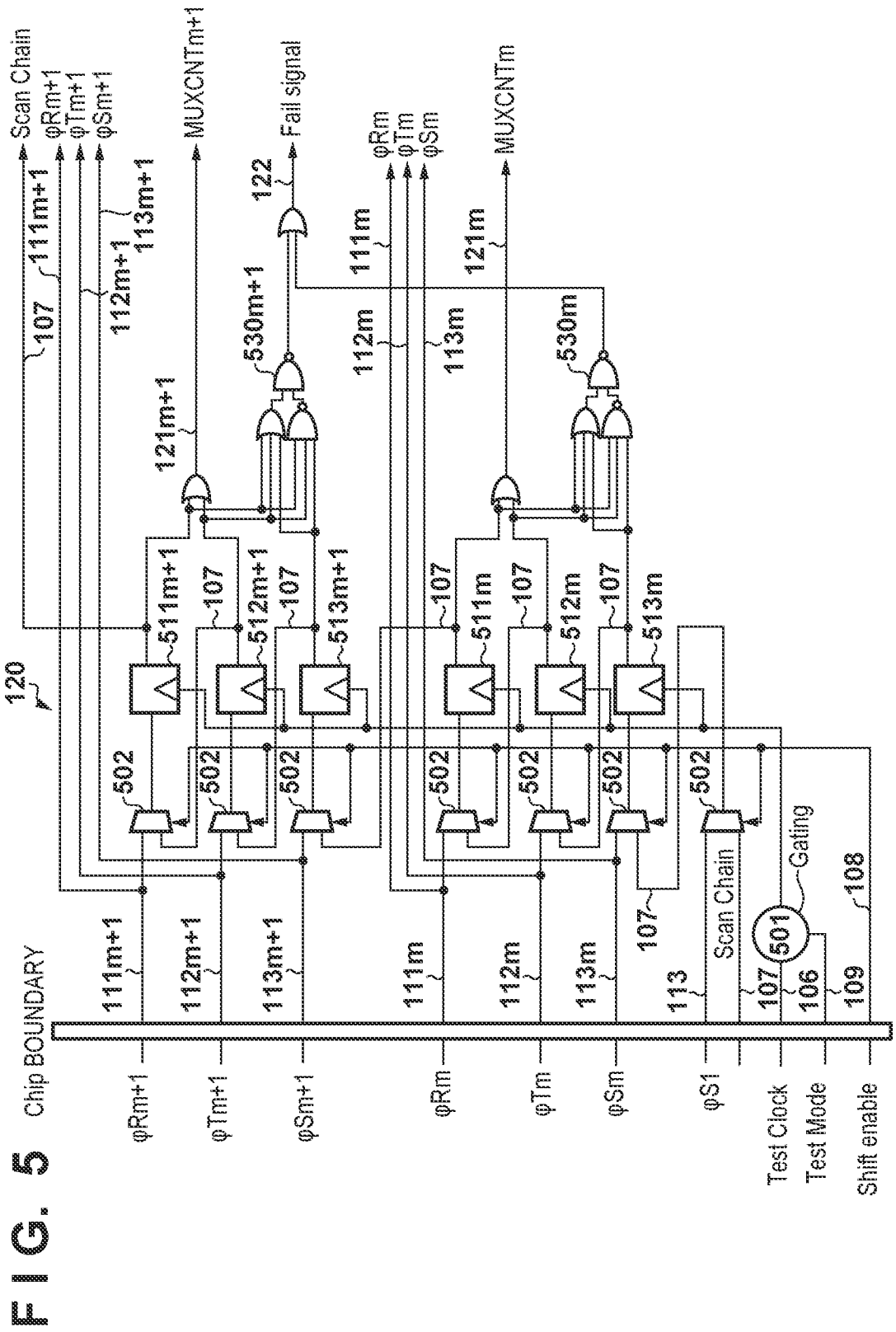
FIG. 5 is a circuit diagram showing the arrangement of a failure detection circuit according to the first embodiment.

FIG. 5 is a circuit diagram showing the arrangement of the failure detection circuit 120 corresponding to the mth and (m+1)th rows of the pixel block 140.

Referring to FIG. 5, a clock gating unit 501 is a circuit that switches between transmission and a stop of the test clock 106. The clock gating unit 501 is controlled to transmit the test clock 106 when the test mode signal 109 is at high level, and to stop the clock when the test mode signal 109 is at low level.

A scan switching unit 502 is a circuit that switches between the scan chain 107 and the row reset signal 111, the transfer signal 112, or the row selection signal 113, and is controlled to select the scan chain 107 when the shift enable signal 108 is at high level.

A flip-flop 511m is a flip-flop that latches the row reset signal 111m for resetting the pixel block of the mth row, and latches the signal output from the scan switching unit 502 in synchronism with the clock output from the clock gating unit 501.

A flip-flop 512m is a flip-flop that latches the transfer signal 112m of the pixel block of the mth row, and latches the signal output from the scan switching unit 502 in synchronism with the clock output from the clock gating unit 501.

A flip-flop 513m is a flip-flop that latches the row selection signal 113m of the pixel block of the mth row, and latches the signal output from the scan switching unit 502 in synchronism with the clock output from the clock gating unit 501.

Similarly, a flip-flop 511m+1 is a flip-flop that latches the row reset signal 111m+1 for resetting the pixel block of the (m+1)th row, and latches the signal output from the scan switching unit 502 in synchronism with the clock output from the clock gating unit 501.

A flip-flop 512m+1 is a flip-flop that latches the transfer signal 112m+1 of the pixel block of the (m+1)th row, and latches the signal output from the scan switching unit 502 in synchronism with the clock output from the clock gating unit 501.

A flip-flop 513m+1 is a flip-flop that latches the row selection signal 113m+1 of the pixel block of the (m+1)th row, and latches the signal output from the scan switching unit 502 in synchronism with the clock output from the clock gating unit 501.

The scan chain 107 continuously connects the flip-flops 511m. 512m, 513m, 511m+1, 512m+1, and 513m+1 via the scan switching units 502.

The shutter control signal 121m+1 is a signal obtained by obtaining, via an OR circuit, the outputs from the flip-flops 511m+1 and 512m+1, and is transmitted to the signal generation circuit 130. The shutter control signal 121m+1 is output as an OR of the outputs from the flip-flops 511m+1 and 512m+1 so that it is set at high level when a connection failure occurs in one of the transfer signal 112m+1 and the row reset signal 111m+1.

Similarly, the shutter control signal 121m is a signal obtained by obtaining, via an OR circuit, the outputs from the flip-flops 511m and 512m, and is transmitted to the signal generation circuit 130. The shutter control signal 121m is output as an OR of the outputs from the flip-flops 511m and 512m so that it is set at high level when a connection failure occurs in one of the transfer signal 112m and the row reset signal 111m.

A failure detection circuit unit 530m+1 is a circuit that determines whether the values of the flip-flops 511m+1, 512m+1, and 513m+1 match an expected value, and outputs a low-level signal when the values match the expected value and outputs a high-level signal when the values do not match the expected value. In this embodiment, the expected value indicates that all the output values of the flip-flops 511m+1, 512m+1, and 513m+1 are at low or high level. Therefore, if all the values of the flip-flops 511m+1, 512m+1, and 513m+1 are at low or high level, the failure detection circuit unit 530m+1 outputs a low-level signal; otherwise, the failure detection circuit unit 530m+1 outputs a high-level signal.

Similarly, a failure detection circuit unit 530m is a circuit that determines whether the values of the flip-flops 511m, 512m, and 513m match an expected value, and outputs a low-level signal when the values match the expected value and outputs a high-level signal when the values do not match the expected value. The failure detection signal 122 is a signal obtained by obtaining an OR of the signals output from the failure detection circuit units 530m+1 and 530m, and is a failure detection signal which is set at high level when the failure detection circuit unit 530m+1 or 530m detects that the values do not match the expected value. Note that the failure detection signal 122 is a signal obtained by obtaining an OR of the values of not only the failure detection circuit units 530m+1 and 530m but also the failure detection circuit units of all the rows of the pixel block 140.

The row reset signals 111m and 111m+1, the transfer signals 112m and 112m+1, and the row selection signals 113m and 113m+1 which are input to the failure detection circuit 120 are output from the signal setting circuit 110, and received by the failure detection circuit 120 across the connection portion between the substrate. The failure detection circuit 120 as a detection circuit is provided on the pixel substrate 101 as the first substrate. This can detect the input states, to the pixel substrate 101, of the signals output from the control substrate 100 as the second substrate.

FIG. 5 shows an example of the arrangement of the failure detection circuit 120 corresponding to the mth and (m+1)th rows of the pixel block 140. However, the arrangement of the failure detection circuit 120 is not limited to the mth and (m+1)th rows, and there exist as many of the same kind of circuits as necessary for shutter control and pixel data readout of the pixel block 140.

[Arrangement of Signal Generation Circuit 130]

The arrangement of the signal generation circuit 130 according to the first embodiment will be described with reference to FIG. 6. Note that the same reference numerals as in FIGS. 1 to 5 denote the same blocks and a description thereof will be omitted.

Figure 6:
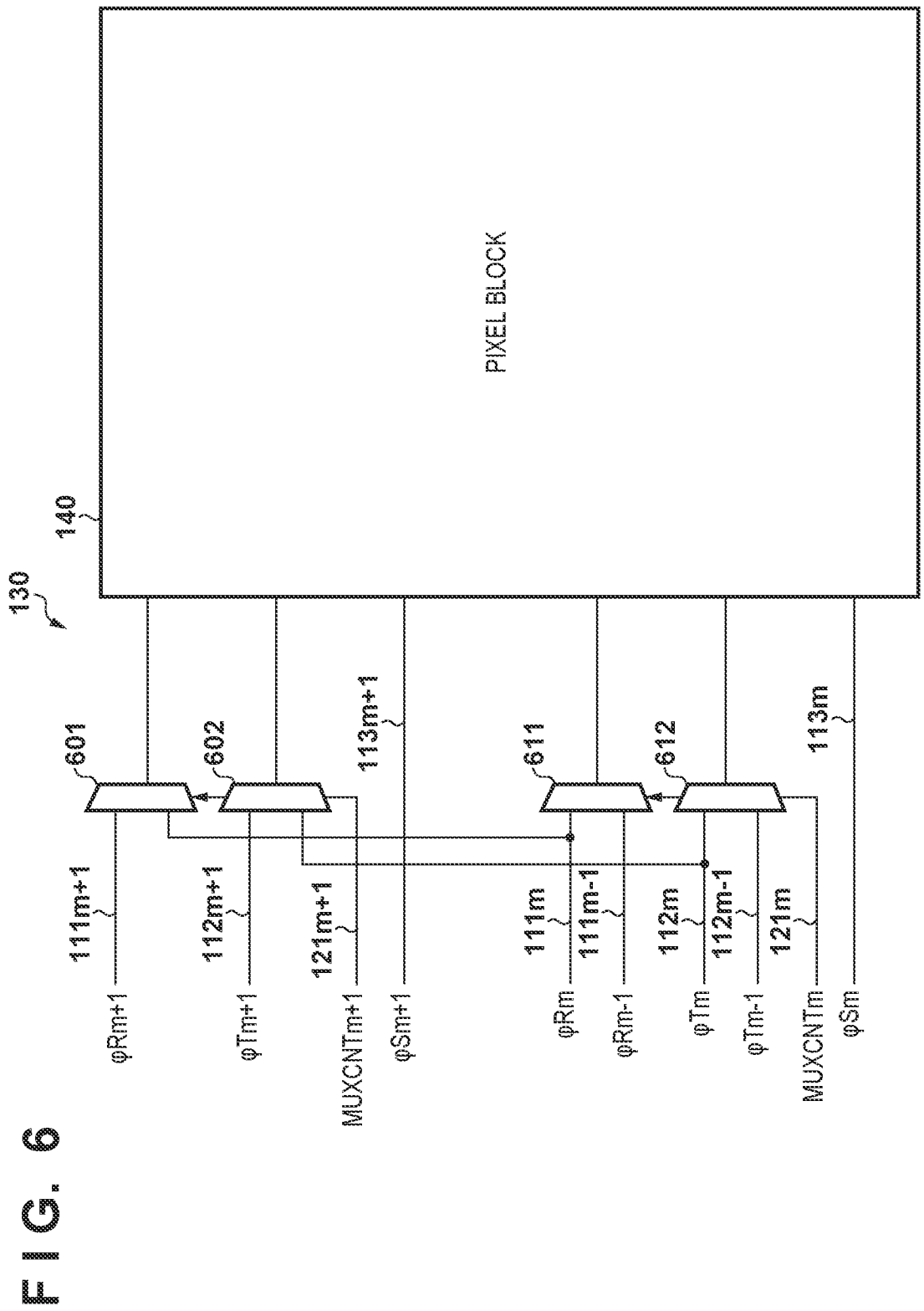
FIG. 6 is a circuit diagram showing the arrangement of a signal generation circuit according to the first embodiment.

FIG. 6 is a circuit diagram showing the arrangement of the signal generation circuit (switching circuit) 130 corresponding to the mth and (m+1)th rows of the pixel block 140.

Referring to FIG. 6, a row reset signal switching unit 601 is a circuit that switches between the row reset signals 111m+1 and 111m in accordance with the value of the shutter control signal 121m+1 output from the failure detection circuit 120. The row reset signal switching unit 601 performs switching to output the row reset signal 111m+1 when the value of the shutter control signal 121m+1 is at low level, and to output the row reset signal 111m of the adjacent row when the value of the shutter control signal 121m+1 is at high level.

A transfer signal switching unit 602 is a circuit that switches between the transfer signals 112m+1 and 112m in accordance with the value of the shutter control signal 121m+1 output from the failure detection circuit 120. The transfer signal switching unit 602 performs switching to output the transfer signal 112m+1 when the value of the shutter control signal 121m+1 is at low level, and to output the transfer signal 112m of the adjacent row when the value of the shutter control signal 121m+1 is at high level.

Similarly, a row reset signal switching unit 611 is a circuit that switches between the row reset signal 111m and a row reset signal 111m−1 in accordance with the value of the shutter control signal 121m output from the failure detection circuit 120. The row reset signal switching unit 611 performs switching to output the row reset signal 111m when the value of the shutter control signal 121m is at low level, and to output the row reset signal 111m−1 of the adjacent row when the value of the shutter control signal 121m is at high level. The row reset signal 111m−1 is a row reset signal used for row reset of the (m−1)th row of the pixel block 140.

A transfer signal switching unit 612 is a circuit that switches between the transfer signal 112m and a transfer signal 112m−1 in accordance with the value of the shutter control signal 121m output from the failure detection circuit 120. The transfer signal switching unit 612 performs switching to output the transfer signal 112m when the value of the shutter control signal 121m is at low level, and to output the transfer signal 112m−1 of the adjacent row when the value of the shutter control signal 121m is at high level. The transfer signal 112m−1 is a transfer signal used in the pixels of the (m−1)th row of the pixel block 140.

FIG. 6 shows an example of the arrangement of the signal generation circuit 130 corresponding to the mth and (m+1)th rows of the pixel block 140. However, the arrangement of the signal generation circuit 130 is not limited to the mth and (m+1)th rows, and there exist as many of the same kind of circuits as necessary for shutter control and pixel data readout of the pixel block 140.

[Procedure of Connection Failure Relief Processing of Connection Portion between Substrates]

The procedure of connection failure relief processing of the connection portion between the substrates according to the first embodiment will be described with reference to FIGS. 7 and 8.

Figure 7:
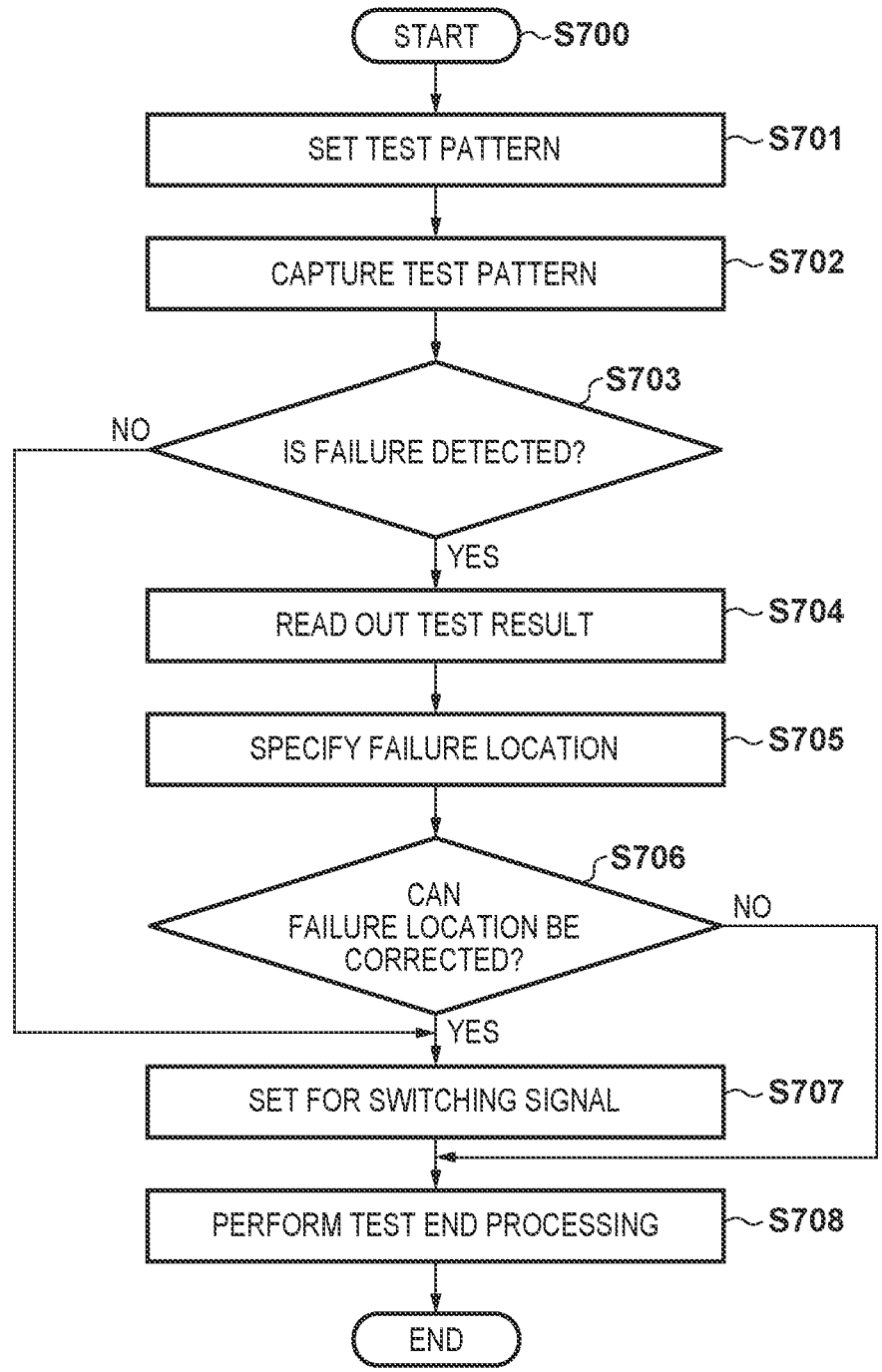
FIG. 7 is a flowchart illustrating the procedure of relief processing of a connection failure according to the first embodiment.
Figure 8:
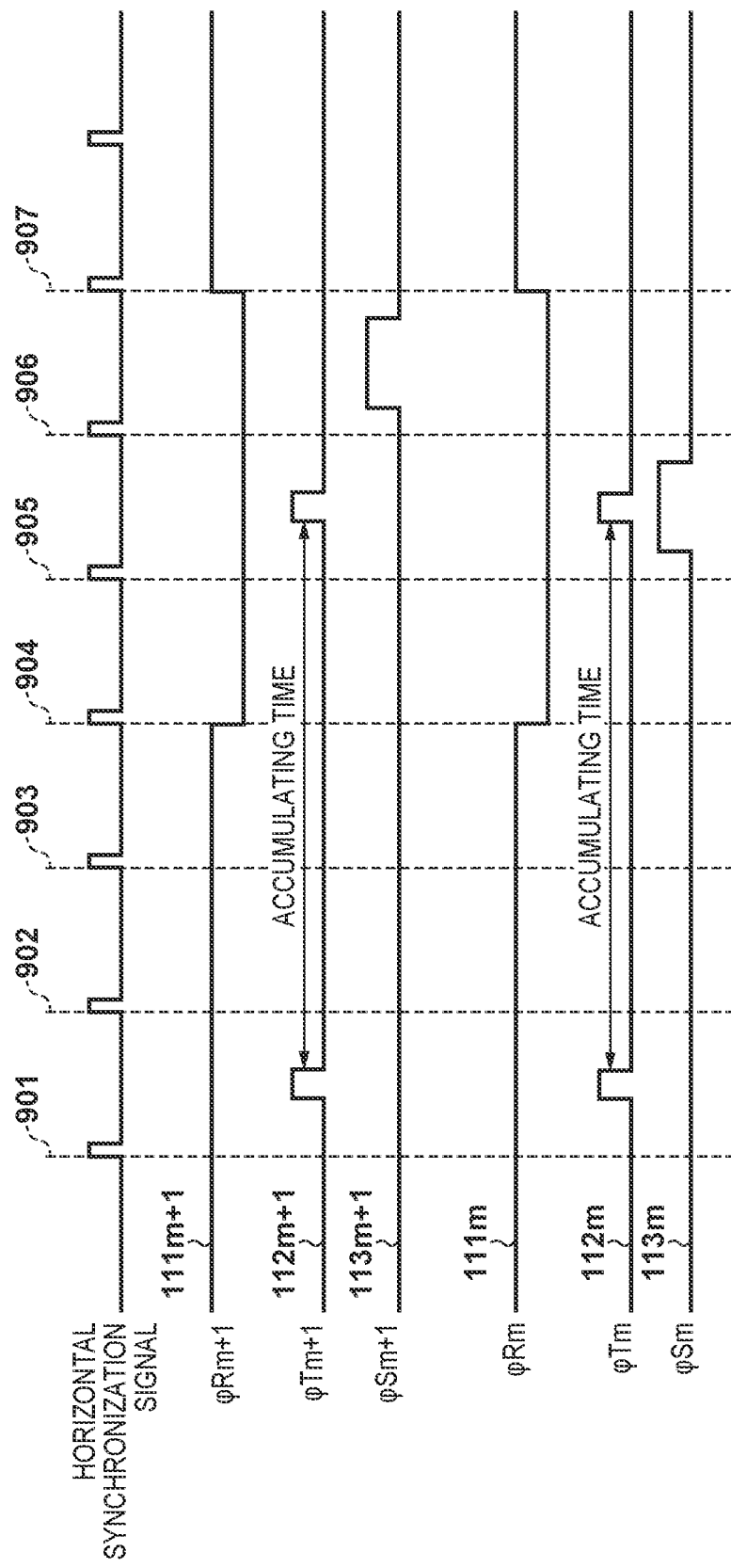
FIG. 8 is a timing chart of the waveforms of the electronic shutter operation according to the first embodiment.

FIG. 7 is a flowchart illustrating the procedure of the relief processing according to this embodiment, and FIG. 8 is a timing chart for supplementing the explanation of the flowchart shown in FIG. 7.

Note that a test of a failure of the connection portion between the substrates may be performed at the time of power-on of the stacked image sensor 180 and the result may be stored in a volatile memory or the like, or a test may be performed at the time of a test in manufacturing of the stacked image sensor 180. By performing a test in manufacturing, it is possible to prevent shipment when the connection state of the connection between the substrates does not satisfy a predetermined state. In this case, the semiconductor device need not include a switching circuit. Alternatively, if a switching circuit relieves a case in which the connection state of the connection between the substrates does not satisfy the predetermined state, the test result (detection result) may be stored in a nonvolatile memory or the like.

Referring to FIG. 7, step S700 is a processing start step, in which the clock 103 is transmitted and the power-on reset signal 102 is asserted.

Step S701 is a test pattern setting step. In step S701, the control circuit 160 outputs the test clock 106, sets the test mode signal 109 at high level, and sets the shift enable signal 108 at high level while outputting test data to the scan chain 107. This sets the test data in the flip-flops 411$m$, 412$m$, 413$m$, 411$m$+1, 412$m$+1, and 413$m$+1 in the signal setting circuit 110. In this embodiment, all the values set in the flip-flops 411$m$, 412$m$, 413$m$, 411$m$+1, 412$m$+1, and 413$m$+1 are at low or high level.

Step S702 is a step in which the failure detection circuit 120 receives the test pattern set in step S701. In step S702, the control circuit 160 stops the test clock 106, and sets the shift enable signal 108 at low level. Next, one pulse of the test clock 106 is transmitted, and thus the flip-flops 511$m$, 512$m$, 513$m$, 511$m$+1, 512$m$+1, and 513$m$+1 in the failure detection circuit 120 capture the test data set in the flip-flops 411$m$, 412$m$, 413$m$, 411$m$+1, 412$m$+1, and 413$m$+1 in the signal setting circuit 110, respectively.

The values captured by the flip-flops 511$m$, 512$m$, 513$m$, 511$m$+1, 512$m$+1, and 513$m$+1 are expected to be the same values as those set in the flip-flops 411$m$, 412$m$, 413$m$, 411$m$+1, 412$m$+1, and 413$m$+1, respectively. Therefore, an expected value indicates that all the values captured by the flip-flops 511$m$, 512$m$, 513$m$, 511$m$+1, 512$m$+1, and 513$m$+1 are at low or high level.

In this embodiment, if all the values captured by the flip-flops 511$m$, 512$m$, 513$m$, 511$m$+1, 512$m$+1, and 513$m$+1 are at low or high level, the failure detection circuit units 530$m$ and 530$m$+1 output low-level signals, and the failure detection signal 122 is also at low level. Alternatively, if not all the values captured by the flip-flops 511$m$, 512$m$, 513$m$, 511$m$+1, 512$m$+1, and 513$m$+1 are at low or high level, the failure detection circuit unit 530$m$ or 530$m$+1 outputs a high-level signal, and the failure detection signal 122 is also at high level.

Step S703 is a step of determining the presence/absence of a failure. If the failure detection signal 122 is at low level, the control circuit 160 determines in step S703 that there is no failure in the shutter signals across the connection portion between the substrates, and the process advances to step S707. On the other hand, if the failure detection signal 122 is at high level, it is determined that there is a failure in the shutter signals across the connection portion between the substrates, and the process advances to step S704.

Step S704 is a step of reading out the test result. If the failure detection signal 122 is at high level, the control circuit 160 sets the shift enable signal 108 at high level, and transmits the test clock 106. The test data captured by the flip-flops 511$m$, 512$m$, 513$m$, 511$m$+1, 512$m$+1, and 513$m$+1 in the failure detection circuit 120 are read out into the control circuit 160 via the scan chain 107.

Step S705 is a step of specifying, from the test data read out in step S704, a location where the failure has occurred. In step S705, the control circuit 160 compares the test data read out in step S704 with the expected value, and specifies bits which do not match the expected value.

In this embodiment, the expected value indicates that all the values are at low or high level. Therefore, the control circuit 160 specifies a location where the failure has occurred, by comparing the test data read out in step S704 with the expected value and specifying the position of data different from the expected value in the test data read out in step S704.

As an example of a method of specifying a failure location, there may be a method of specifying a location where a failure has occurred, by obtaining an XOR of the expected value and the test data read out in step S704 bit by bit. Note that the method of specifying a failure location is not limited to the method of this embodiment, and other methods may be used.

Step S706 is a step of determining whether the failure location specified in step S705 in a signal transmission path connecting the substrates can be corrected. In this embodiment, if the row reset signal 111 or the transfer signal 112 fails in only one row or a plurality of discontinuous rows, the failure location can be corrected.

In step S706, if the failure location of the connection portion between the substrates satisfies the above condition, the control circuit 160 determines that the failed row reset signal 111 or transfer signal 112 can be corrected, and the process advances to step S707. If the failure location satisfies a condition other than the above condition, it is determined that the failed row reset signal 111 or transfer signal 112 cannot be corrected, and the process advances to step S708. Note that the condition for determining that the signal can be corrected changes depending on the system configuration, and the present invention is not limited to the above condition.

Step S707 is a step of making, if it is determined in step S706 that the connection failure location can be corrected, a setting of performing correction by switching to the shutter signal of the adjacent row. If, for example, the row reset signal 111$m$+1 of the (m+1)th row has failed, the control circuit 160 sets the shift enable signal 108 at high level, and transmits the test clock 106. Furthermore, the control circuit 160 sets a high-level signal in the flip-flop 511$m$+1 in the failure detection circuit 120 with respect to the scan chain 107. If a high-level signal is set in the flip-flop 511$m$+1 in the failure detection circuit 120, the shutter control signal 121$m$+1 is set at high level. Then, in the signal generation circuit 130, switching from the failed row reset signal 111$m$+1 to the row reset signal 111$m$ of the adjacent row is performed.

If it is determined in step S703 that there is no failure, a low-level signal is set in all the flip-flops in the failure detection circuit 120 in step S707. After the end of step S707, the process advances to step S708.

Step S708 is a step of performing test end processing. In step S708, the control circuit 160 asserts the test end signal 104 indicating the end of the test, and outputs the failure detection signal 122 as the test result signal 105. Furthermore, the control circuit 160 outputs, as the failure location notification signal 170, information of the bit string which does not match the expected value and has been specified in step S705 to the outside of the stacked image sensor 180. After that, the test mode signal 109 is set at low level, and the process ends.

If the test mode signal 109 is set at low level, the clock gating unit 501 stops clock transmission. Therefore, the flip-flops in the failure detection circuit 120 continuously hold the values even during a normal operation. By outputting the failure location to the outside of the stacked image sensor 180 using the failure location notification signal 170, the system side can relieve the failure using correction such as image complement processing.

FIG. 8 is a timing chart showing the waveforms of the shutter signals when the processing of this embodiment is applied.

Referring to FIG. 8, timings 901 to 907 indicate synchronization timings of the horizontal synchronization signal of the CMOS sensor. The signal waveforms indicate waveforms when the row reset signal 111$m$+1 of the (m+1)th row fails and the shutter signals are switched to the row reset signal 111$m$ and the transfer signal 112$m$ of the mth row.

Since the row reset signals and the transfer signals simultaneously operate on the mth and (m+1)th rows, the transfer signals 112$m$ and 112$m$+1 simultaneously change during a period from the timing 901 to the timing 902 to start accumulation of the PDs 201 and 211.

During a period from the timing 904 to the timing 907, the row reset signals 111$m$ and 111$m$+1 are at low level at the same time. When the transfer signals 112$m$ and 112$m$+1 are simultaneously set at high level during a period from the timing 905 to the timing 906, the charges accumulated in the PDs 201 and 211 are transferred to the FD units 202 and 212, respectively. When the row selection signal 113$m$ is set at high level during the period from the timing 905 to the timing 906, the charges accumulated in the FD unit 202 are read out as an electrical signal into the column signal line 141. Next, when the row selection signal 113$m$+1 is set at high level during a period from the timing 906 to the timing 907, the charges accumulated in the FD unit 212 are read out as an electrical signal into the column signal line 141. Since the readout period of the row selection signal 113 is different between the mth row and the (m+1)th row, the pixel data of the (m+1)th row can be read out.

Note that in this embodiment, as a unit of holding a failure location, the flip-flops in the failure detection circuit 120 are used. However, it is apparent that if no signal connection test between the substrates is performed at the time of activation of the substrates, the same processing can be performed by writing the failure location in the nonvolatile memory.

As described above, if a failure occurs in the signal path of the row reset signal 111 or the transfer signal 112 as a signal for connecting the substrates, the failure location is detected and switching to the signals of the adjacent row is performed, thereby making it possible to relieve the failure of the row reset signal 111 or the transfer signal 112.

This embodiment has explained the example of relieving the failure of the row reset signal 111 and the transfer signal 112. However, the present invention is not limited to relief of the row reset signal 111 and the transfer signal 112. For example, for the CMOS image sensor including pixels whose paths of the column signal lines are different, it is apparent that it is possible to relieve a connection failure of the row selection signal 113 by the same method.

As described above, according to this embodiment, it is possible to detect that the connection state of the connection portion between the substrates does not satisfy the predetermined state. Even if the connection state does not satisfy the predetermined state, it is possible to continue the processing by relieving the signal across the connection portion. Note that in this embodiment, the presence/absence of a connection failure is detected. However, the present invention is not limited to this. That is, the degree (for example, the resistance value of an electrical path) of the connection state of the connection portion between the substrates may be detected. Then, if the semiconductor device includes a switching circuit, the switching circuit switches the control signals in accordance with the detection result. For example, if the resistance value is detected as an example of detection, the switching circuit switches the control signals in accordance with whether the resistance value is higher than a predetermined resistance value.

Second Embodiment

In this embodiment, only part of the arrangement of the first embodiment is different. Therefore, a description of the same portions will be omitted and only the different portions will be described in detail.

If the reset cancellation period of a row reset signal is the minimum period of a horizontal synchronization signal, switching the shutter signals of the adjacent row may be insufficient as a method of relieving a failure of the row reset signal or a transfer signal as a signal for connecting substrates. This embodiment will describe a method capable of relieving a row reset signal or a transfer signal even if the reset cancellation period of the row reset signal is the minimum period of a horizontal synchronization signal.

Figure 9:
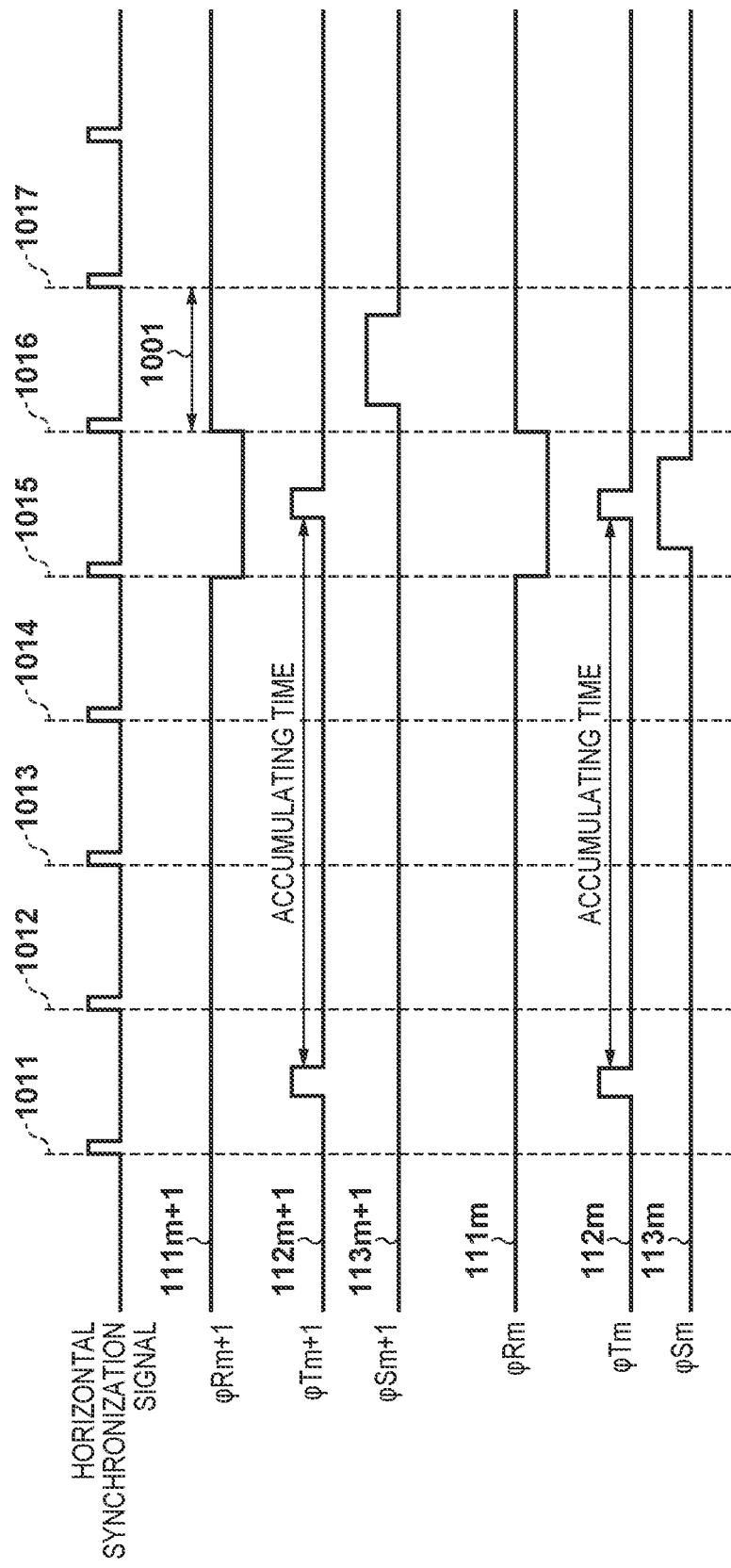
FIG. 9 is a timing chart of the waveforms of an electronic shutter operation according to the second embodiment.

FIG. 9 is a timing chart showing waveforms when a row reset signal 111$m$+1 and a transfer signal 112$m$+1 of the (m+1)th row are replaced by a row reset signal 111$m$ and a transfer signal 112$m$ of the mth row if the reset cancellation period of the row reset signal is the minimum period of a horizontal synchronization signal.

In FIG. 9, timings 1011 to 1017 indicate synchronization timings of the horizontal synchronization signal of a CMOS sensor. Shutter signals perform a shutter operation in synchronism with the horizontal synchronization signal at the timings 1011 to 1017.

Referring to FIG. 9, a period 1001 indicates a period during which pixel data of the (m+1)th row are read out. During the period 1001, when a row selection signal 113$m$+1 of the (m+1)th row is at high level, the row reset signal 111$m$+1 is at high level (reset state). Therefore, in the case shown in FIG. 9 in which the row reset signal 111$m$+1 and the transfer signal 112$m$+1 of the (m+1)th row are replaced by the row reset signal 111$m$ and the transfer signal 112$m$ of the mth row, all the pixel data are cleared at the time of reading out the pixel data of the (m+1)th row, and the pixel data cannot be read out.

Figure 10:
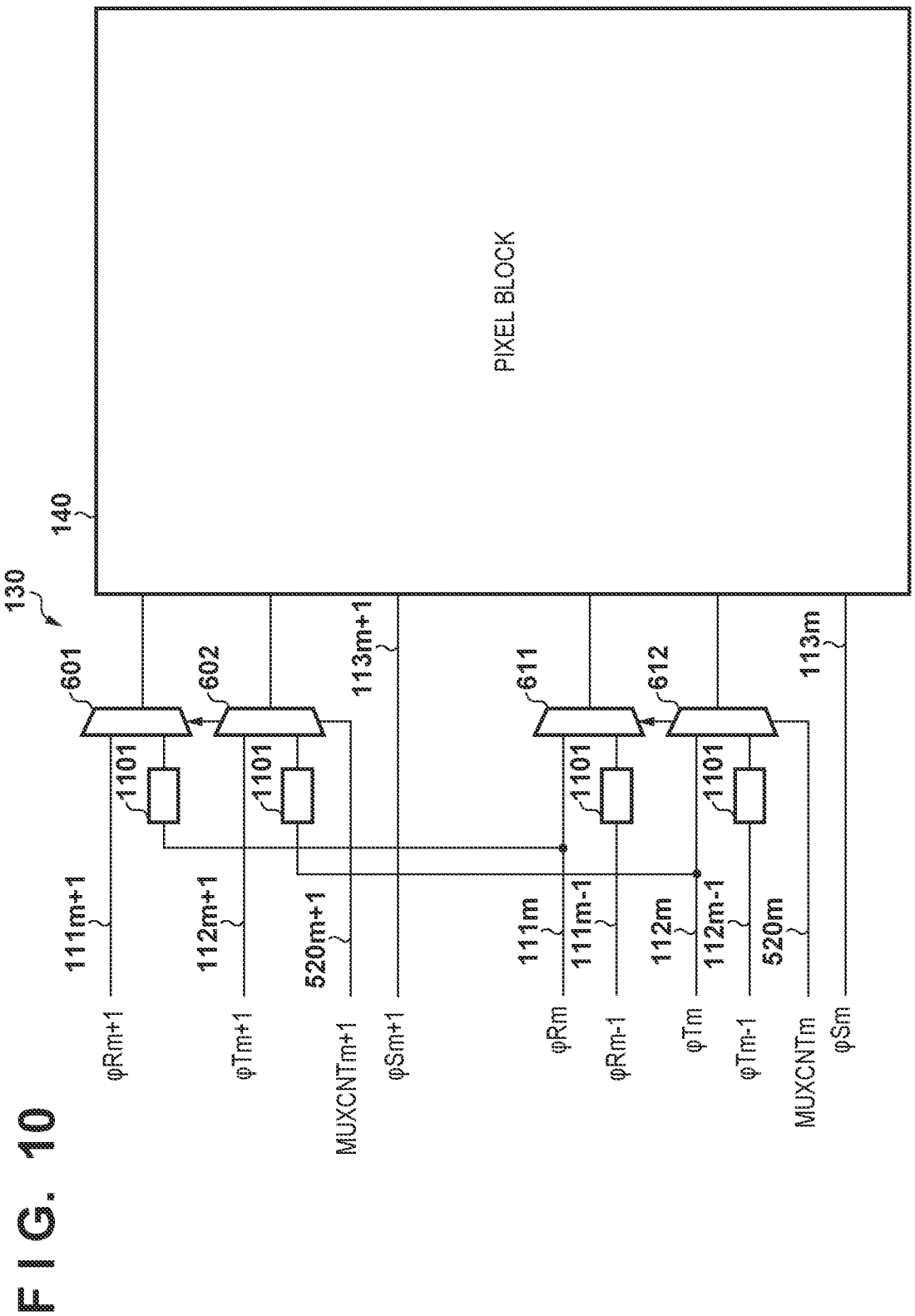
FIG. 10 is a circuit diagram showing the arrangement of a signal generation circuit according to the second embodiment.

FIG. 10 is a circuit diagram showing the arrangement of a signal generation circuit 130 corresponding to the mth and (m+1)th rows of a pixel block 140 according to this embodiment. Referring to FIG. 10, reference numeral 1101 denotes a delay element.

By inserting the delay element 1101 to the preceding stage of a row reset signal switching unit 601 and a transfer signal switching unit 602, the row reset signal 111m and the transfer signal 112m of the adjacent row are delayed at the time of switching the signals, thereby generating signals that enable pixel data to be read out. In this embodiment, as the delay amount of the delay element 1101, the minimum period of the horizontal synchronization signal is set.

Figure 11:
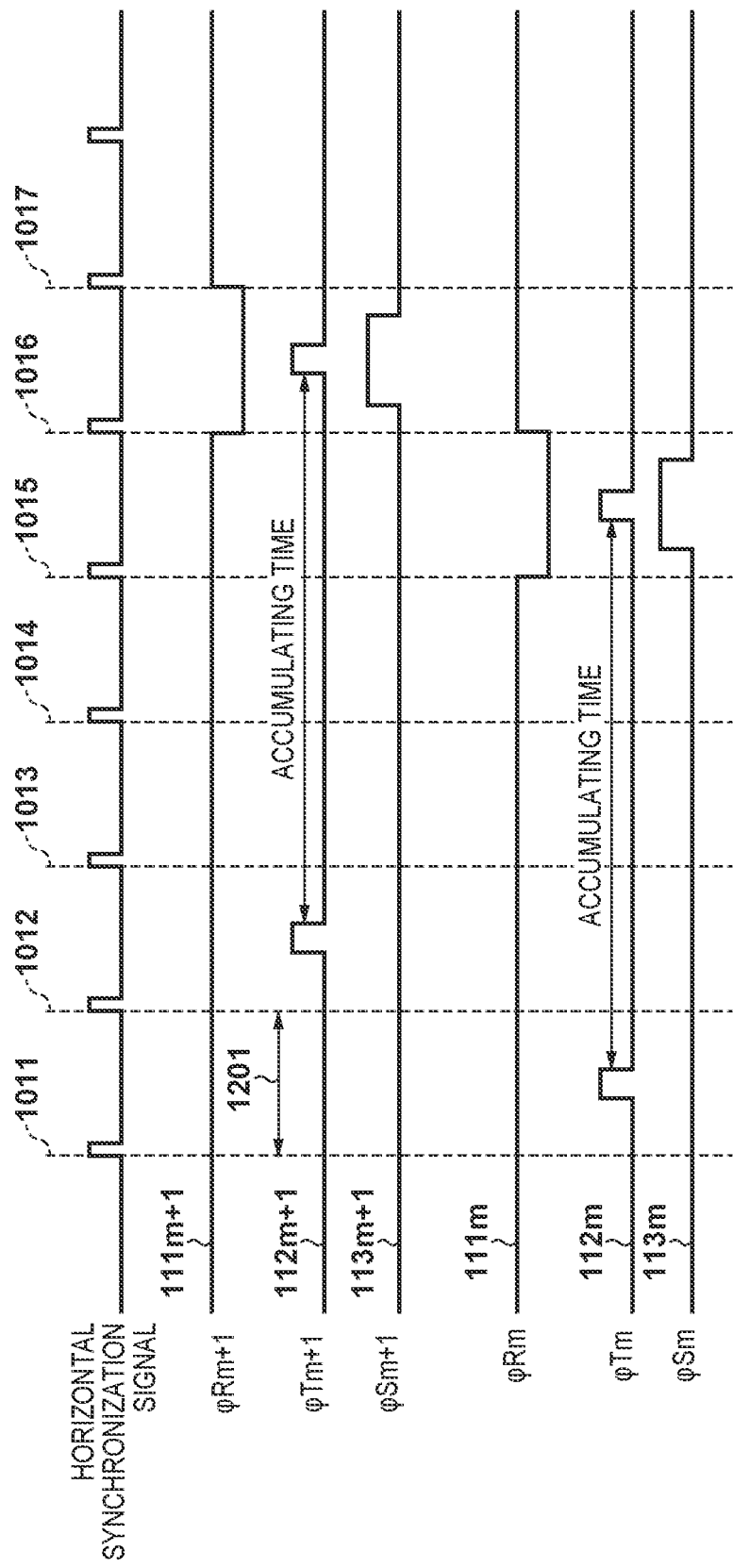
FIG. 11 is a timing chart of the waveforms of the electronic shutter operation according to the second embodiment.

FIG. 11 is a timing chart showing waveforms in the arrangement shown in FIG. 10 when the row reset signal 1m+1 and the transfer signal 112m+1 of the (m+1)th row are replaced by the row reset signal 111m and the transfer signal 112m of the mth row.

Referring to FIG. 11, a period 1201 indicates a delay time generated by the delay element 1101, and the row reset signal 111m and the transfer signal 112m are delayed by the minimum period of the horizontal synchronization signal. This can set the row reset signal 111m+1 at low level while the row selection signal 113m+1 is at high level, thereby making it possible to read out the pixel data.

As described above, when a connection failure occurs in the connection portion between the substrates, even if the reset cancellation period of the row reset signal is the minimum period of the horizontal synchronization signal, it is possible to relieve a failure of the row reset signal or the transfer signal for connecting the substrates, and to continue image capturing processing.

Third Embodiment

In this embodiment, only part of the arrangement of the first embodiment is different. Therefore, a description of the same portions will be omitted and only the different portions will be described in detail.

At the time of a normal operation, a connection failure may occur in a signal path connecting substrates. This embodiment will describe a method in which even if a failure occurs, at the time of a normal operation, in the path of a row reset signal or a transfer signal for connecting the substrates, it is possible to relieve the row reset signal or the transfer signal by detecting the failure.

Figure 12:
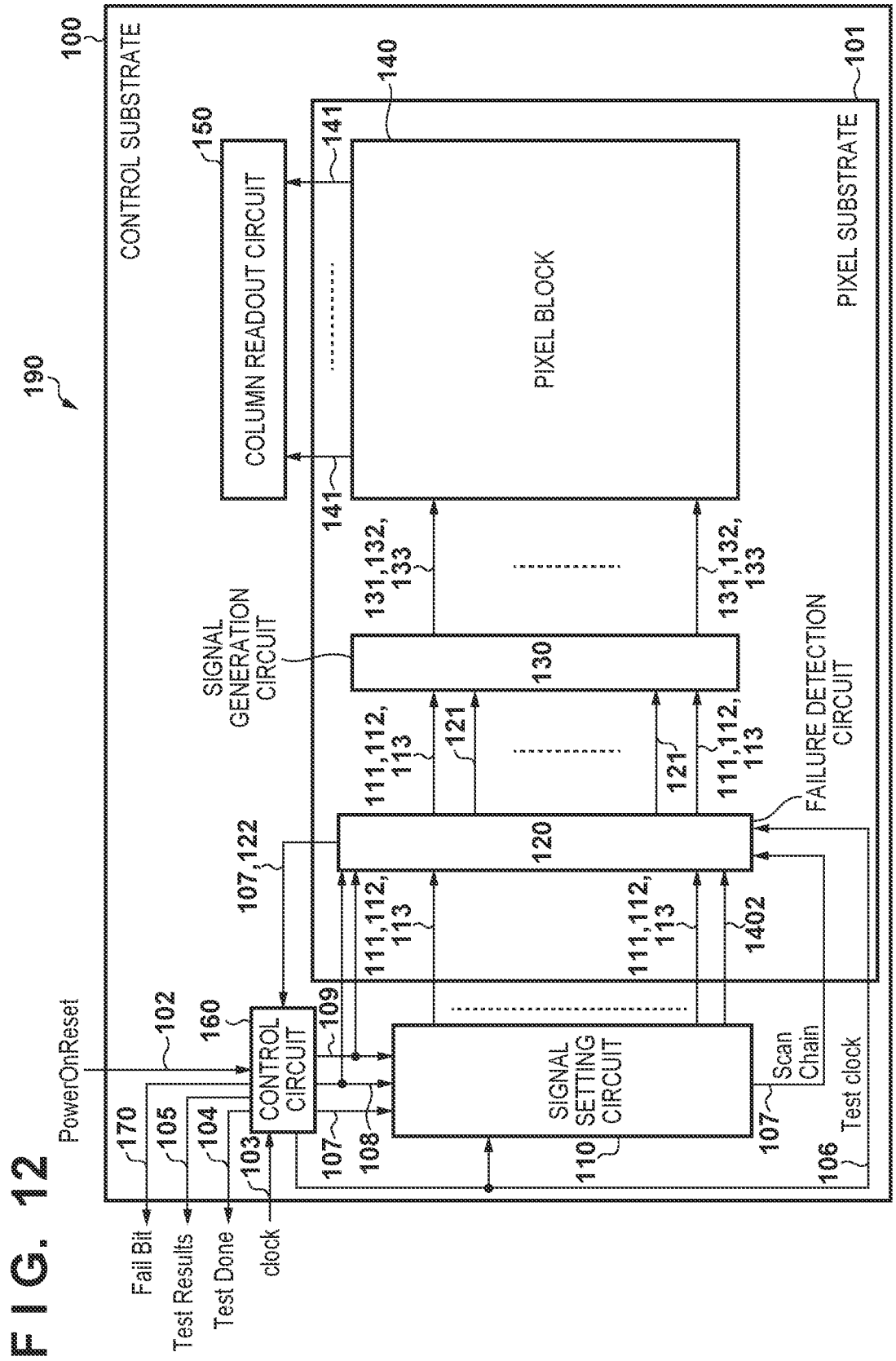
FIG. 12 is a block diagram showing the arrangement of a stacked image sensor according to the third embodiment.

FIG. 12 is a block diagram showing the arrangement of a stacked image sensor 190 according to the third embodiment. Referring to FIG. 12, parity bit signals 1402 are output from a signal setting circuit 110 and input to a failure detection circuit 120 across the connection portion between the substrates.

Figure 13:
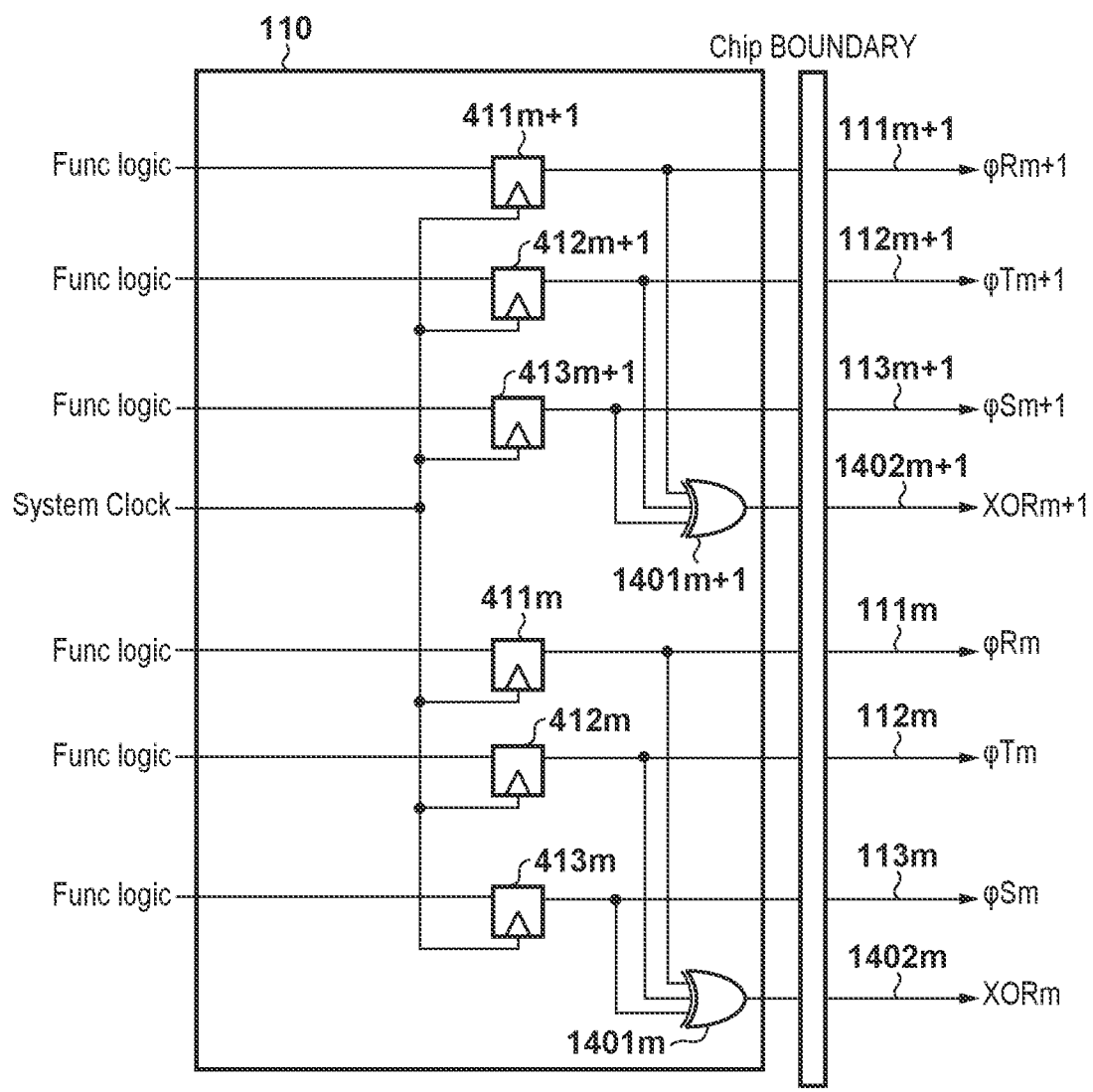
FIG. 13 is a circuit diagram showing the arrangement of a signal setting circuit according to the third embodiment.

FIG. 13 is a circuit diagram showing the arrangement of the signal setting circuit 110 corresponding to the mth and (m+1)th rows of a pixel block 140 according to this embodiment.

At the time of a normal function operation, flip-flops 411m. 412m, and 413m change the values of shutter signals 111m, 112m, and 113m at arbitrary timings necessary for image readout, respectively, in synchronism with a system clock. Similarly, flip-flops 411m+1, 412m+1, and 413m+1 also change the values of shutter signals 111m+1, 112m+1, and 113m+1 at arbitrary timings necessary for image readout, respectively, in synchronism with the system clock.

Referring to FIG. 13, a parity bit generation circuit 1401m obtains an XOR of the shutter signals 111m, 112m, and 113m, and generates a parity bit 1402m. The parity bit 1402m generated by the parity bit generation circuit 1401m is output from the signal setting circuit 110, and transmitted to the failure detection circuit 120 across the substrates. The value of the parity bit 1402m sequentially changes in accordance with the changes of the shutter signals 111m, 112m, and 113m.

Similarly, a parity bit generation circuit 1401m+1 obtains an XOR of the shutter signals 111m+1, 112m+1, and 113m+1, and generates a parity bit 1402m+1. The parity bit 1402m+1 generated by the parity bit generation circuit 1401m+1 is output from the signal setting circuit 110, and transmitted to the failure detection circuit 120 across the substrates. The value of the parity bit 1402m+1 sequentially changes in accordance with the changes of the shutter signals 111m+1, 112m+1, and 113m+1.

FIG. 13 shows an example of the arrangement of the signal setting circuit 110 corresponding to the mth and (m+1)th rows of the pixel block 140. However, the arrangement of the signal setting circuit 110 is not limited to the mth and (m+1)th rows, and there exist as many of the same kind of circuits as necessary for shutter control and pixel data readout of the pixel block 140.

Figure 14:
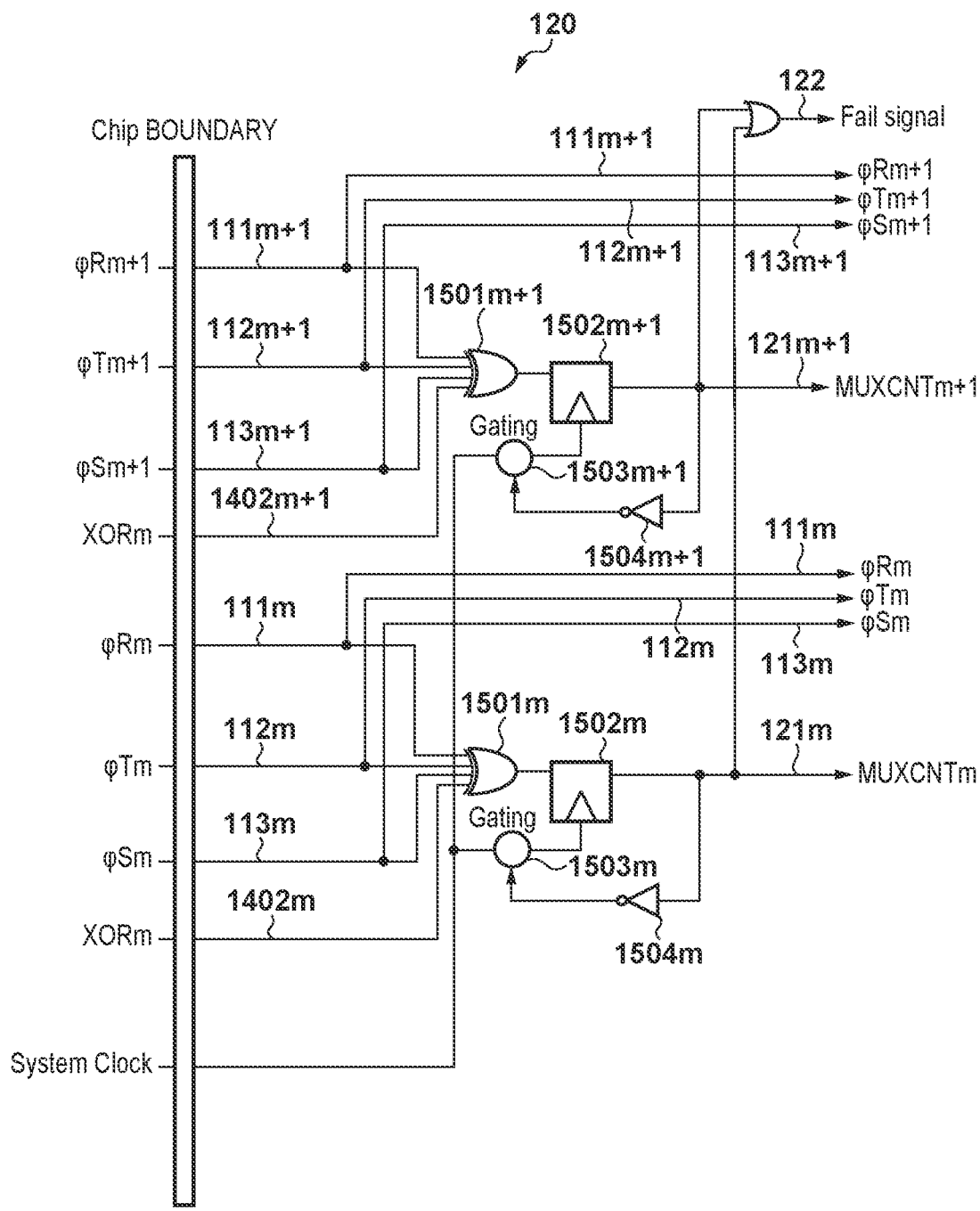
FIG. 14 is a circuit diagram showing the arrangement of a failure detection circuit according to the third embodiment.

FIG. 14 is a circuit diagram showing the arrangement of the failure detection circuit 120 corresponding to the mth and (m+1)th rows of the pixel block 140 according to this embodiment.

Referring to FIG. 14, a parity check circuit 1501m obtains an XOR of the shutter signals 111m, 112m, and 113m and the parity bit 1402m. In this embodiment, since even parity is used, if the output signal of the parity check circuit 1501m is at low level, no connection failure has occurred in signal paths connecting the substrates of the shutter signals 111m, 112m, and 113m and the parity bit 1402m. On the other hand, if the output signal of the parity check circuit 1501m is at high level, it can be estimated that a connection failure has occurred in the signal path connecting the substrates of one of the shutter signals 111m, 112m, and 113m and the parity bit 1402m.

The output signal of the parity check circuit 1501m is input to a flip-flop 1502m. A clock gating unit 1503m is a circuit that outputs a clock for driving the flip-flop 1502m, and outputs the system clock only when the value of the flip-flop 1502m is at low level, and stops the clock when the value of the flip-flop 1502m is at high level.

An inverter circuit 1504m is a circuit that inverts the value of the flip-flop 1502m, and generates a clock enable signal of the clock gating unit 1503m. The value of the flip-flop 1502m is output as the shutter control signal 121m to the signal generation circuit 130.

With the above arrangement, the flip-flop 1502m latches the value when the parity check circuit 1501m outputs a high-level signal, and continuously holds the value until the clock gating unit 1503m stops the clock and the power-on reset signal is asserted next.

Upon receiving a shutter control signal 121m, a signal generation circuit 130 performs the operation described in the first or second embodiment, thereby making it possible to relieve a failed shutter signal.

A failure detection signal 122 is a failure detection signal indicating that a connection failure of the connection portion between the substrates has occurred, and is set at high level when an error is detected as a parity check result. This signal is generated by obtaining an OR of the output signals of all the flip-flops 1502.

The failure detection signal 122 is output to a control circuit 160 to notify, as a test result signal 105, the outside of the substrates of the presence/absence of a failure. When a system outside the substrates detects that the value of the test result signal 105 is at high level, it is possible to detect the occurrence of a connection failure in the connection portion between the substrates. As described above, the system using the stacked image sensor according to this embodiment can detect the occurrence of a connection failure in the connection portion between the substrates.

FIG. 14 shows an example of the arrangement of the failure detection circuit 120 corresponding to the mth and (m+1)th rows of the pixel block 140. However, the arrangement of the failure detection circuit 120 is not limited to the mth and (m+1)th rows, and there exist as many of the same kind of circuits as necessary for shutter control and pixel data readout of the pixel block 140.

As described above, even if a connection failure occurs in the connection portion between the substrates at the time of a normal operation, it is possible to continue image capturing processing by detecting the connection failure and relieving a connection failure signal.

Note that each embodiment of this specification has explained the example of using, as a photoelectric conversion unit, a photodiode that accumulates charges generated by light. As another example, an avalanche photodiode may be used as a photoelectric conversion unit.

Furthermore, each embodiment of this specification has exemplified an image sensor including photoelectric conversion units. As another example, a light-emitting device (display device) in which each pixel includes a light-emitting element may be used. As a typical example of the light-emitting element is an OLED. In the light-emitting device, at least two transistors of the first transistor for supplying a current to the light-emitting element and the second transistor for giving, to the first transistor, data for controlling the supply amount of the current are arranged in each pixel. The two transistors are controlled by various kinds of signals output from the signal setting circuit 110 of the control substrate 100. The signals are supplied from the control substrate 100 to the pixel substrate 101 via the connection portion between the substrates. Even in this form, by providing the failure detection circuit of each of the above-described embodiments, it is possible to detect a connection portion failure around the connection portion between the substrates. It is also possible to relieve the connection portion failure.

As described above, each of the embodiments described in this specification can be applied to a semiconductor device in which a plurality of substrates are stacked, for example, an image capturing device such as an image sensor or a light-emitting device such as an OLED.

Other Embodiments

Figure 15A:
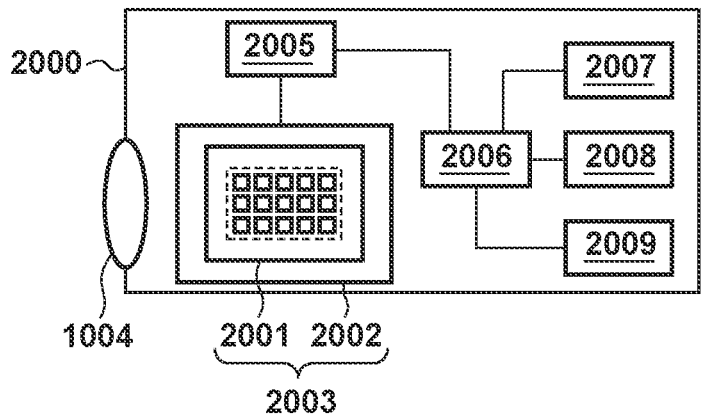
FIGS. 15A, 15B, and 15C are views showing the arrangement of an equipment including a stacked image sensor.

An embodiment of an equipment 2000 including a semiconductor device 2003 will be described in detail with reference to FIG. 15A. The semiconductor device 2003 may be a stacked image sensor according to any one of the above-described embodiments. The semiconductor device 2003 may include a semiconductor device 2001 and a package 2002 accommodating the semiconductor device 2001. The package 2002 may include a base on which the semiconductor device 2001 is fixed and a cover made of glass or the like facing the semiconductor device 2001. The package 2002 may further include a connection member such as a bonding wire and bump for connecting a terminal of the base and a terminal (bonding pad) of the semiconductor device 2001.

The equipment 2000 may include at least one of an optical device 2004, a control device 2005, a processing device 2006, a display device 2007, a storage device 2008, and a mechanical device 2009. The optical device 2004 is implemented by, for example, a lens, a shutter, and a mirror. The control device 2005 controls the semiconductor device 2003. The control device 2005 is, for example, a semiconductor device such as an FPGA (Field Programmable Gate Array) or an ASIC (Application Specific Integrated Circuit).

The processing device 2006 processes a signal output from the semiconductor device 2003. The processing device 2006 is a semiconductor device such as a CPU (Central Processing Unit) or an ASIC for forming an AFE (Analog Front End) or a DFE (Digital Front End). The display device 2007 is an EL (Electro-Luminescence) display device or a liquid crystal display device that displays information (image) obtained by the semiconductor device 2003. The storage device 2008 is a magnetic device or a semiconductor device that stores the information (image) obtained by the semiconductor device 2003. The storage device 2008 is a volatile memory such as an SRAM (Static Random Access Memory) or a DRAM (Dynamic Random Access Memory) or a nonvolatile memory such as a flash memory or a hard disk drive.

The mechanical device 2009 includes a moving or propulsion unit such as a motor or an engine. In the equipment 2000, the mechanical device 2009 displays the signal output from the semiconductor device 2003 on the display device 2007 and performs external transmission by a communication device (not shown) of the equipment 2000. To do this, the equipment 2000 may further include the storage device 2008 and the processing device 2006 in addition to the memory circuits and arithmetic circuits included in the semiconductor device 2003. The mechanical device 2009 may be controlled based on the signal output from the semiconductor device 2003.

In addition, the equipment 2000 is suitable for an electronic equipment such as an information terminal (for example, a smartphone or a wearable terminal) which has a shooting function or a camera (for example, an interchangeable lens camera, a compact camera, a video camera, or a monitoring camera). The mechanical device 2009 in the camera may drive the components of the optical device 2004 in order to perform zooming, an in-focus operation, and a shutter operation. Alternatively, the mechanical device 200) in the camera may move the semiconductor device 2003 in order to perform an anti-vibration operation.

Furthermore, the equipment 2000 can be a transportation equipment such as a vehicle, a ship, or an airplane. The mechanical device 2009 in a transportation equipment can be used as a moving device. The equipment 2000 as a transportation equipment may be used as an equipment that transports the semiconductor device 2003 or an equipment that uses a shooting function to assist and/or automate driving (steering). The processing device 2006 for assisting and/or automating driving (steering) may perform, based on the information obtained by the semiconductor device 2003, processing for operating the mechanical device 2009 as a moving device. Alternatively, the equipment 2000 may be a medical equipment such as an endoscope, a measurement equipment such as an analysis distance measurement sensor, an analysis equipment such as an electron microscope, or an office equipment such as a copy machine.

Figure 15B:
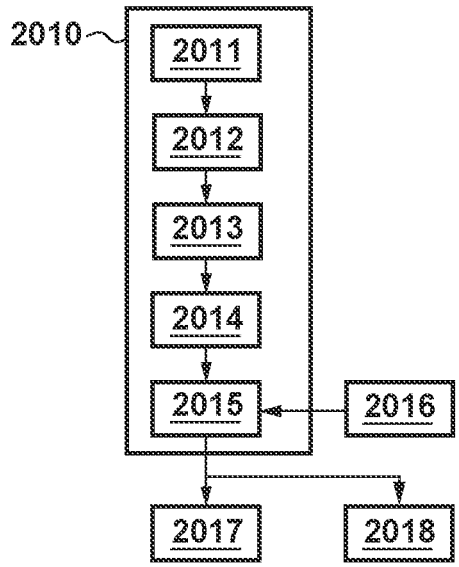
Figure 15C:
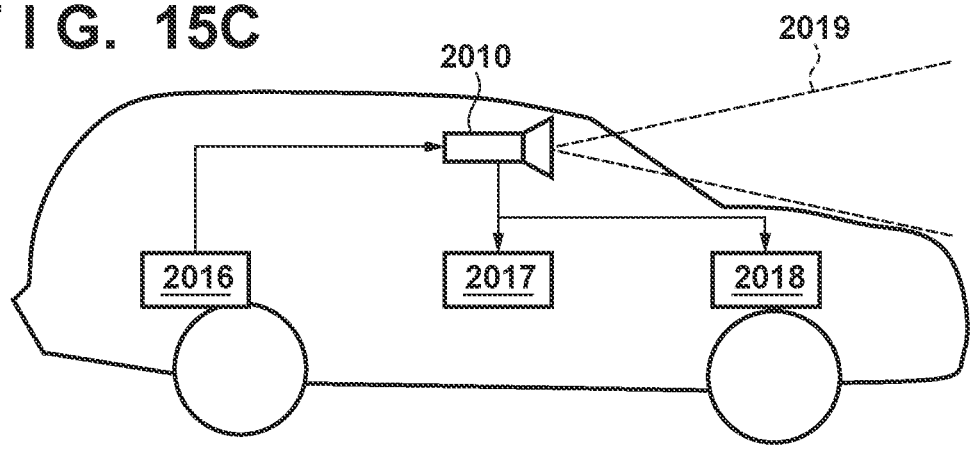

An embodiment of an image capturing system and a moving body will be described with reference to FIGS. 15B and 15C. FIG. 15B shows an example of an image capturing system 2010 concerning an in-vehicle camera. The image capturing system 2010 includes a photoelectric conversion device 2011. The photoelectric conversion device 2011 may be any one of the stacked image sensors described in the above embodiments. The image capturing system 2010 includes an image processing unit 2012 as a processing device that performs image processing for a plurality of image data acquired by the photoelectric conversion device 2011. The image capturing system 2010 also includes a parallax acquisition unit 2013 as a processing device that calculates a parallax (the phase difference of a parallax image) from the plurality of image data acquired by the photoelectric conversion device 2011. In addition, the image capturing system 2010 includes a distance acquisition unit 2014 as a processing device that calculates the distance to a target object based on the calculated parallax, and a collision determination unit 2015 as a processing device that determines based on the calculated distance whether there is a collision possibility. In this example, the parallax acquisition unit 2013 and the distance acquisition unit 2014 are examples of an information acquisition unit that acquires information such as distance information to a target object. That is, the distance information is information about a parallax, a defocus amount, a distance to a target object, or the like. The collision determination unit 2015 may determine the collision possibility using one of these pieces of distance information. Each of the above-described various kinds of processing devices may be implemented by specially designed hardware or by general-purpose hardware for performing arithmetic processing based on a software module. Alternatively, each processing device may be implemented by an FPGA, an ASIC, or the like or by a combination thereof.

The image capturing system 2010 is connected to a vehicle information acquisition device 2016, and can acquire vehicle information such as a vehicle speed, a yaw rate, and a steering angle. The image capturing system 2010 is connected to a control ECU 2017 as a control device that outputs a control signal to generate a braking force to the vehicle based on the determination result of the collision determination unit 2015. That is, the control ECU 2017 is an example of a moving body control unit that controls a moving body based on distance information. The image capturing system 2010 is also connected to an alarm device 2018 that generates an alarm to the driver based on the determination result of the collision determination unit 2015. For example, if the collision possibility is high as the determination result of the collision determination unit 2015, the control ECU 2017 performs vehicle control to avoid a collision or reduce damage by, for example, braking, releasing the accelerator pedal, or suppressing the engine output. The alarm device 2018 warns the user by, for example, sounding an alarm such as a sound, displaying alarm information on the screen of a car navigation system or the like, or applying a vibration to a seat belt or steering wheel.

In this embodiment, the image capturing system 2010 captures the periphery, for example, the front or rear of the vehicle. FIG. 15C shows the image capturing system 2010 in a case in which the front of the vehicle (image capturing range 2019) is captured. The vehicle information acquisition device 2016 sends an instruction to operate the image capturing system 2010 and execute image capturing.

An example in which control is performed not to cause a collision against another vehicle has been described above. However, the image capturing system can also be applied to control for automated driving following another vehicle or automated driving without deviation from a lane. Furthermore, the image capturing system can be applied not only to a vehicle such as an automobile but also to, for example, a moving body (transportation equipment) such as a ship, an airplane, or an industrial robot. The moving device in the moving body (transportation equipment) includes various kinds of moving units such as an engine, motor, wheels, and propellers. In addition, the image capturing system can also be applied not only to the moving body but also to an equipment that widely uses object recognition, such as Intelligent Transport Systems (ITS).

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-033729, filed Mar. 3, 2021, which is hereby incorporated by reference herein in its entirety.

What is claimed is:

1. A semiconductor device in which a plurality of substrates including a first substrate and a second substrate are stacked, wherein
    the first substrate includes a pixel unit in which a plurality of pixels are arranged,
    the second substrate includes a control circuit configured to control the semiconductor device, and
    the first substrate further includes a detector configured to detect a connection state of a connection portion between the first substrate and the second substrate,
    wherein the detector has at least one logic circuit and the first substrate includes the at least one logic circuit, and
    wherein the first substrate includes a switching circuit configured to switch, in accordance with a result of the detection by the detector, a control signal transmitted from the second substrate to the first substrate via the connection portion.

2. The device according to claim 1, wherein the switching circuit switches, to a control signal of another pixel row, a control signal of a pixel row where the detector has detected a failure.

3. The device according to claim 2, wherein the switching circuit switches, to a control signal of an adjacent pixel row, the control signal of the pixel row where the detector has detected the failure.

4. The device according to claim 1, wherein the switching circuit generates a signal by changing a delay time of a control signal of another pixel row, and switches, to the signal, a control signal of a pixel row where a failure has been detected.

5. The device according to claim 1, wherein the control circuit outputs a control signal necessary for signal switching to the switching circuit in accordance with the result of the detection.

6. The device according to claim 1, wherein the control circuit has a function of notifying an outside of the second substrate of the presence/absence of a failure of the connection portion.

7. The device according to claim 1, wherein the control circuit has a function of notifying an outside of the second substrate of information indicating a location of a failure of the connection portion.

8. The device according to claim 1, wherein the control circuit is activated at the time of power-on.

9. The device according to claim 8, further comprising a volatile memory configured to store a result of the detection.

10. The device according to claim 1, wherein the control circuit is activated at the time of a test in manufacturing of the semiconductor device.

11. The device according to claim 10, further comprising a nonvolatile memory configured to store a result of the detection.

12. The device according to claim 1, wherein the first substrate includes a readout path different for each pixel.

13. The device according to claim 1, wherein the pixel includes a photoelectric conversion unit.

14. The device according to claim 13, wherein the photoelectric conversion unit is a photodiode configured to accumulate charges based on light.

15. The device according to claim 13, wherein the photoelectric conversion unit is an avalanche photodiode.

16. The device according to claim 1, wherein the pixel includes a light-emitting element.

17. An equipment comprising:

a semiconductor device in which a plurality of substrates including a first substrate and a second substrate are stacked, the first substrate including a pixel unit in which a plurality of pixels are arranged, the second substrate including a control circuit configured to control the semiconductor device, and the first substrate further including a detector configured to detect a connection state of a connection portion between the first substrate and the second substrate, the detector having at least one logic circuit and the first substrate including the at least one logic circuit, the first substrate including a switching circuit configured to switch, in accordance with a result of the detection by the detector, a control signal transmitted from the second substrate to the first substrate via the connection portion; and at least one of an optical device corresponding to the semiconductor device, a control device configured to control the semiconductor device, a processing device configured to process a signal output from the semiconductor device, a display device configured to display information obtained by the semiconductor device, a storage device configured to store the information obtained by the semiconductor device, and a mechanical device configured to operate based on the information obtained by the semiconductor device.

* * * * *